United States Patent
Yoon et al.

(10) Patent No.: US 9,570,170 B2
(45) Date of Patent: Feb. 14, 2017

(54) RESISTIVE MEMORY DEVICE AND METHOD OF OPERATING THE SAME

(71) Applicants: Chi-Weon Yoon, Seoul (KR); Hyun-Kook Park, Anyang-Si (KR); Yeong-Taek Lee, Seoul (KR); Bo-Geun Kim, Suwon-Si (KR); Yong-Kyu Lee, Hwaseong-Si (KR)

(72) Inventors: Chi-Weon Yoon, Seoul (KR); Hyun-Kook Park, Anyang-Si (KR); Yeong-Taek Lee, Seoul (KR); Bo-Geun Kim, Suwon-Si (KR); Yong-Kyu Lee, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/839,606

(22) Filed: Aug. 28, 2015

(65) Prior Publication Data

US 2016/0148683 A1    May 26, 2016

(30) Foreign Application Priority Data

Nov. 26, 2014  (KR) .......................... 10-2014-0166627

(51) Int. Cl.
| | |
|---|---|
| *G11C 8/00* | (2006.01) |
| *G11C 13/00* | (2006.01) |
| *G11C 11/56* | (2006.01) |
| *G11C 11/16* | (2006.01) |

(52) U.S. Cl.
CPC ....... *G11C 13/0069* (2013.01); *G11C 11/5607* (2013.01); *G11C 11/5678* (2013.01); *G11C 11/5685* (2013.01); *G11C 13/004* (2013.01); *G11C 13/0028* (2013.01); *G11C 11/1657* (2013.01); *G11C 11/1673* (2013.01); *G11C 11/1675* (2013.01); *G11C 13/0004* (2013.01); *G11C 13/0007* (2013.01); *G11C 2213/72* (2013.01)

(58) Field of Classification Search
CPC .................................................. G11C 13/0028
USPC ....................................................... 365/230.06
See application file for complete search history.

(56) References Cited

U.S. PATENT DOCUMENTS

| | | | |
|---|---|---|---|
| 7,417,887 | B2 | 8/2008 | Cho et al. |
| 7,457,151 | B2 | 11/2008 | Cho et al. |
| 7,554,832 | B2 | 6/2009 | Fasoli et al. |
| 7,957,180 | B2 | 6/2011 | Yoon |
| 7,974,116 | B2 | 7/2011 | Choi et al. |
| 7,978,495 | B2 | 7/2011 | Kawazoe et al. |
| 8,004,927 | B2 | 8/2011 | Scheuerlein et al. |

(Continued)

FOREIGN PATENT DOCUMENTS

JP          2009266312          11/2009

*Primary Examiner* — Hoai V Ho
(74) *Attorney, Agent, or Firm* — Volentine & Whitt, PLLC

(57) ABSTRACT

A memory device includes a memory cell array having multiple memory cells arranged respectively in regions where first signal lines cross second signal lines. The memory device further includes a decoder having multiple line selection switch units connected respectively to the of first signal lines. Each of the multiple line selection switch units applies a bias voltage to a first signal line corresponding to each of the multiple line selection switch units in response selectively to a first switching signal and a second switching signal, voltage levels of which are different from each other in activated states.

16 Claims, 26 Drawing Sheets

(56) References Cited

U.S. PATENT DOCUMENTS

| | | |
|---|---|---|
| 8,406,036 B2 | 3/2013 | Kono |
| 8,451,681 B2 | 5/2013 | Maejima |
| 8,705,266 B2 | 4/2014 | Sasaki |
| 8,787,068 B2 | 7/2014 | Seko et al. |
| 2004/0212014 A1* | 10/2004 | Fujito .................. G11C 7/1051 257/355 |
| 2013/0155750 A1* | 6/2013 | Maejima .................. G11C 8/08 365/51 |

* cited by examiner

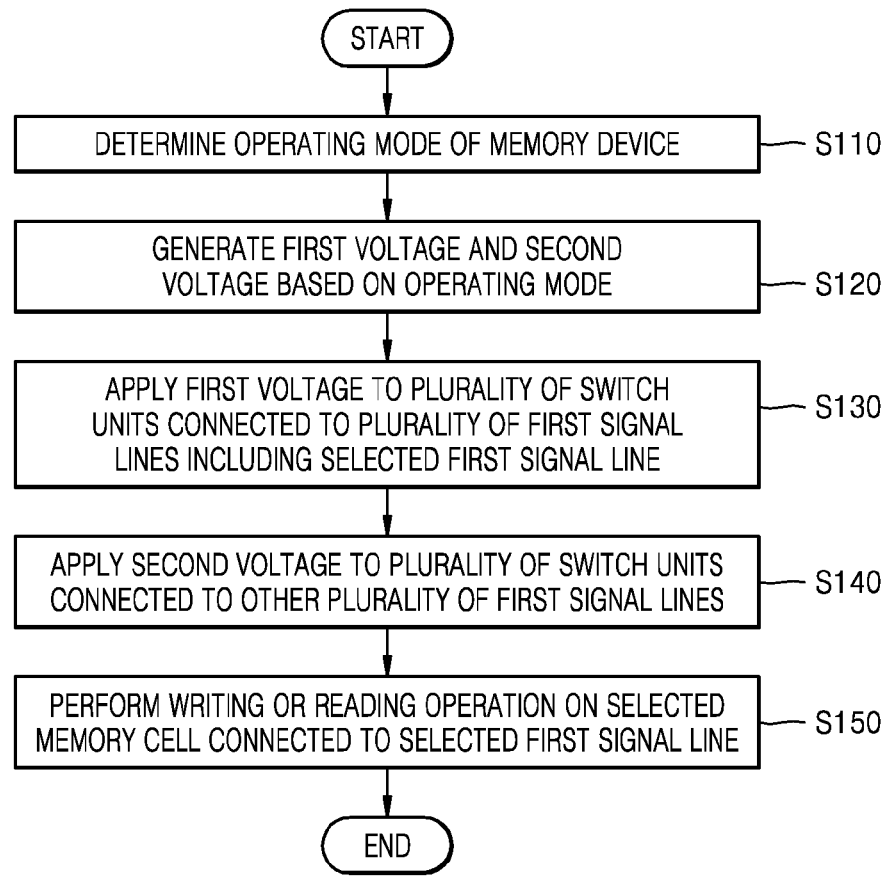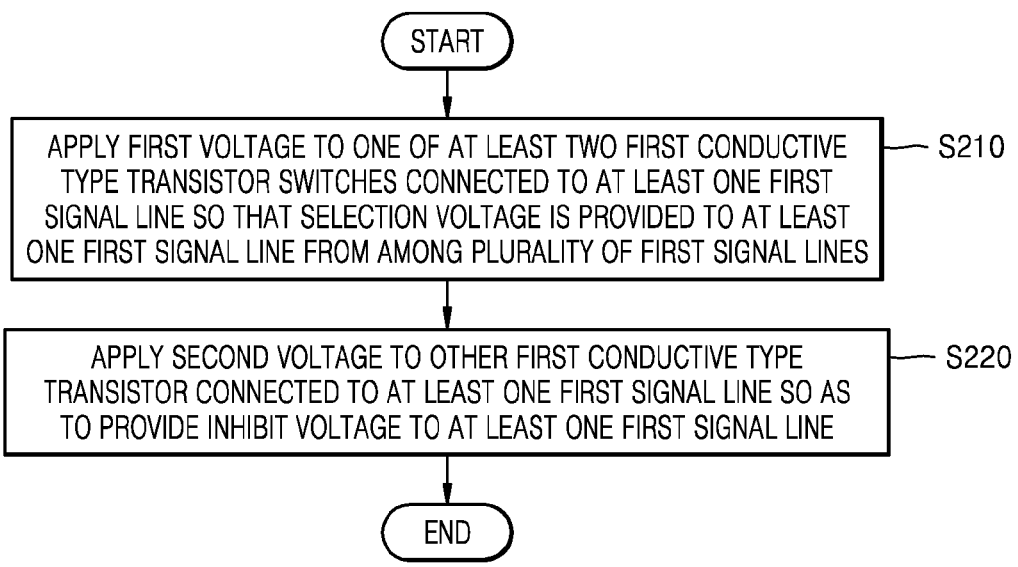

RESISTIVE MEMORY DEVICE AND METHOD OF OPERATING THE SAME

CROSS-REFERENCE TO RELATED APPLICATIONS

A claim for priority under 35 U.S.C. §119 is made to Korean Patent Application No. 10-2014-0166627, filed on Nov. 26, 2014, in the Korean Intellectual Property Office, the entire contents of which are hereby incorporated by reference.

BACKGROUND

Embodiments of the inventive concept relate to a memory device, and more particularly, to a resistive memory device and a method of operating the resistive memory device.

As the demand for high capacity and low power consumption memory devices has increased, research into next-generation memory devices, such as non-volatile memory devices that do not require a refresh operation, is being conducted. These next-generation memory devices are required to have a high integrity characteristic like Dynamic Random Access Memory (DRAM), have a non-volatile characteristic like flash memory, and have high speed like static RAM (SRAM). Phase-change RAM (PRAM), Nano Floating Gate Memory (NFGM), Polymer RAM (PoRAM), Magnetic RAM (MRAM), Ferroelectric RAM (FeRAM), and Resistive RAM (RRAM) have been highlighted as some of the next-generation memory devices.

SUMMARY

Embodiments of the inventive concept provide a resistive memory device capable of increasing durability and reducing power consumption, and a method of operating the resistive memory device.

According to an aspect of the inventive concept, there is provided a memory device including a memory cell array and a decoder. The memory cell array includes a plurality of memory cells arranged respectively in regions where a plurality of first signal lines cross a plurality of second signal lines. The decoder includes a plurality of line selection switch units connected respectively to the plurality of first signal lines. Each of the line selection switch units applies a bias voltage to a first signal line corresponding to each of the line selection switch units in response selectively to a first switching signal and a second switching signal, voltage levels of which are different from each other in activated states.

According to another aspect of the inventive concept, there is provided a memory device including a memory cell array and a switch block. The memory cell array includes a first region including at least one selected memory cell and a second region including unselected memory cells. The switch block applies a selection voltage or an inhibit voltage to first signal lines in the first region in response to a first switching signal of a first voltage and applying an inhibit voltage to first signal lines in the second region in response to a second switching signal of a second voltage.

According to an aspect of the inventive concept, there is provided a method of operating a memory device including a plurality of memory cells arranged respectively in regions where a plurality of first signal lines and a plurality of second signal lines cross each other, and each of the plurality of first signal lines is connected to at least two first conductive type transistor switches for providing a bias voltage. The method includes applying a first voltage to one of the at least two first conductive type transistor switches that are connected to at least one first signal line, so that a selection voltage is applied to the at least one first signal line from among the plurality of first signal lines; and applying a second voltage having a different voltage level than a voltage level of the first voltage to another of the at least two first conductive type transistor switches, so that an inhibit voltage is provided to the at least one first signal line.

According to an aspect of the inventive concept, there is provided a method of operating a memory device including a plurality of memory cells arranged in regions of a memory cell array such that a plurality of first signal lines cross a plurality of second signal lines, the plurality of first signal lines being connected to corresponding switch units, each switch unit comprising a plurality of transistor switches for providing bias voltages to the plurality of memory cells for performing writing or reading operations. The method includes determining an operating mode of the memory device; generating a first voltage and second voltage based on the determined operating mode, the first voltage and the second voltage being voltages of two switching signals in activated states, respectively; applying the first voltage to a first switch unit connected to a selected first signal line of the plurality of first signal lines in a first region to provide a selection voltage to the selected first signal line, and applying the first voltage to another switch unit connected to an unselected first signal line in the first region to provide an inhibit voltage to the unselected first signal line; applying the second voltage the switch units other than the first switch unit connected to unselected first signal lines in regions other than the first region to provide the inhibit voltage to the unselected first signal lines; and performing the writing operation or the reading operation on the memory cell connected to the selected first signal line according to the operating mode.

BRIEF DESCRIPTION OF THE DRAWINGS

Exemplary embodiments of the inventive concept will be more clearly understood from the following description taken in conjunction with the accompanying drawings, in which:

FIG. 22 is a flowchart of a method of operating a memory device according to an exemplary embodiment;

FIG. 23 is a flowchart of a method of operating a memory device according to another exemplary embodiment;

DETAILED DESCRIPTION OF THE EMBODIMENTS

Figure 1:
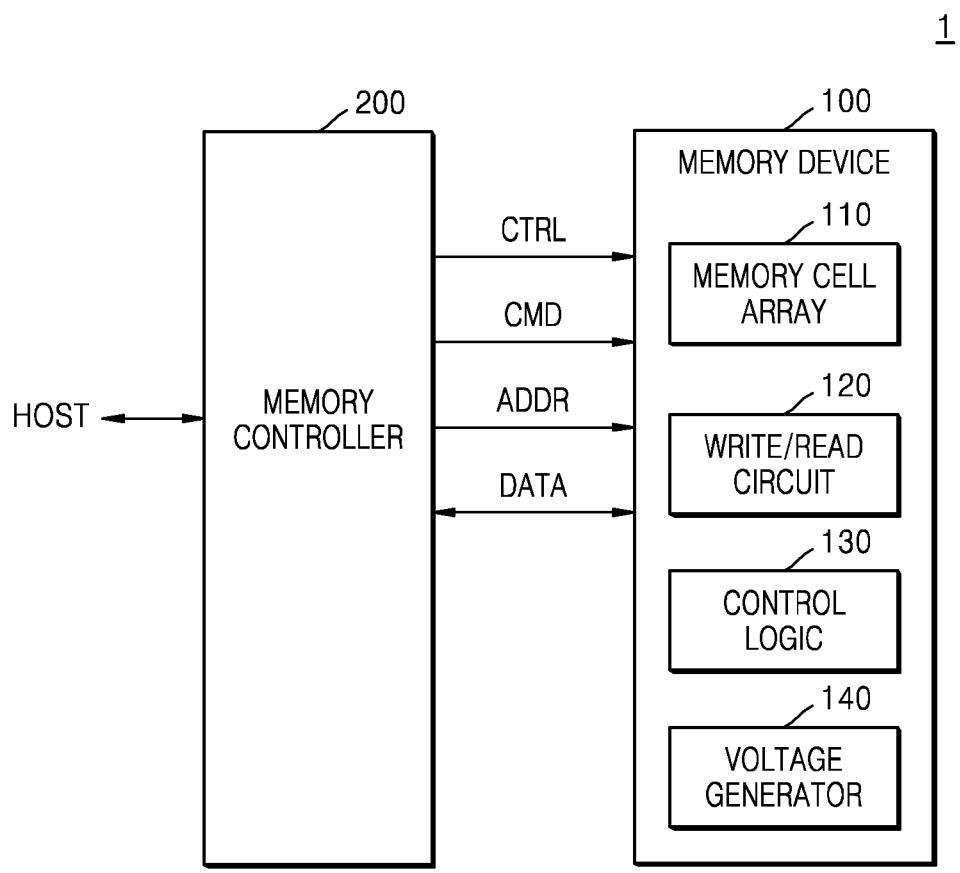
FIG. 1 is a block diagram of a memory system including a resistive memory device, according to an exemplary embodiment of the inventive concept.

Embodiments will be described more fully with reference to the following description and accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to one of ordinary skill in the art. Thus, embodiments of the inventive concept may include all revisions, equivalents, or substitutions which are included in the concept and the technical scope related to the present inventive concept. Known processes, elements, and techniques may not be described with respect to some of the embodiments. Unless otherwise noted, like reference numerals denote like elements throughout the attached drawings and written description, and thus descriptions may not be repeated. In the drawings, the dimension of structures may be exaggerated for clarity.

Furthermore, all examples and conditional language recited herein are to be construed as being not limited to such specifically recited examples and conditions. Throughout the specification, a singular form may include plural forms, unless there is a particular description contrary thereto. Also, terms such as "comprise" or "comprising" are used to specify existence of a recited form, a number, a process, an operation, a component, and/or groups thereof, not excluding the existence of one or more other recited forms, one or more other numbers, one or more other processes, one or more other operations, one or more other components and/or groups thereof.

While terms "first" and "second" are used to describe various components, it is obvious that the components are not limited to the terms "first" and "second". The terms "first" and "second" are used only to distinguish between each component. For example, a first component may indicate a second component or a second component may indicate a first component without conflicting with the inventive concept.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

As used herein, the term "and/or" includes any and all combinations of one or more of the associated listed items. Expressions such as "at least one of," when preceding a list of elements, modify the entire list of elements and do not modify the individual elements of the list. The term "exemplary" is intended to refer to an example or illustration.

FIG. 1 is a block diagram of a memory system 1 including a resistive memory device 100 according to an exemplary embodiment of the present inventive concept.

Referring to FIG. 1, the memory system 1 includes the resistive memory device 100 (hereinafter, referred as the memory device 100) and a memory controller 200. The memory device 100 includes a memory cell array 110, a write/read circuit 120, control logic 130, and a voltage generator 140. Also, the memory device 100 may further include circuits for performing writing and reading operations on the memory cell array 110 under control of the control logic 130. Since the memory cell array 110 includes resistive memory cells, the memory system 1 may be called a resistive memory system.

In response to a write/read request from a host, the memory controller 200 may read data stored in the memory device 100 or may control the memory device 100 to write data to the memory device 100. In more detail, the memory controller 200 may provide an address ADDR, a command CMD, and a control signal CTRL to the memory device 100 and thus may control a program (or write) operation, a read operation, and/or an erase operation with respect to the memory device 100. Also, data DATA to be written and data DATA to be read may be exchanged between the memory controller 200 and the memory device 100.

Although not illustrated, the memory controller 200 may include a Random Access Memory (RAM), a processing unit, a host interface, and a memory interface. The RAM may be used as an operation memory of the processing unit.

The processing unit may control operations of the memory controller 200. The host interface may include a protocol for exchanging data between the host and the memory controller 200. For example, the memory controller 200 may communicate with an external source (i.e., the host) by using at least one of various interface protocols including Universal Serial Bus (USB), MultiMediaCard (MMC), Peripheral Component Interconnect Express (PCI-E), Advanced Technology Attachment (ATA), Serial-ATA, Parallel-ATA, Small Computer System Interface (SCSI), Earth Science Data Interface (ESDI), and Integrated Drive Electronics (IDE).

The memory cell array 110 includes a plurality of memory cells (not shown) that are disposed respectively in regions where a plurality of first signal lines and a plurality of second signal lines cross each other. In the present exemplary embodiment, the first signal lines may be bit lines, and the second signal lines may be word lines. In another exemplary embodiment, the first signal lines may be word lines, and the second signal lines may be bit lines.

In the present exemplary embodiment, each of the of memory cells may be a single level cell (SLC) that stores one bit data, or may be a multilevel cell (MLC) that stores at least two-bit data. Alternatively, the memory cell array 110 may include both the SLCs and the MLCs. When one bit data is written to one memory cell, the memory cells may have two resistance level distributions according to the written data. Alternatively, when two-bit data is written to one memory cell, the memory cells may have four resistance level distributions according to the written data. In another exemplary embodiment, if a memory cell is a triple level cell (TLC) that stores three-bit data, the memory cells may have eight resistance level distributions according to the written data. However, one or more exemplary embodiments of the inventive concept are not limited thereto. Thus, in other exemplary embodiments, each of the memory cells may store at least four-bit data.

In the present exemplary embodiment, the memory cell array 110 may include memory cells with a two-dimensional (2D) horizontal structure. In another exemplary embodiment, the memory cell array 110 may include memory cells with a three-dimensional (3D) vertical structure.

According to an exemplary embodiment, the memory cell array 110 may include a plurality of cell regions. The cell regions may be defined in various ways. For example, the cell region may be a page unit including a plurality of memory cells connected to the same word line. As another example, the cell region may be a plurality of memory cells connected to the word lines and the bit lines. In addition, the word lines may be connected to one row decoder (or a row selection block) and the bit lines may be connected to one column decoder (or a column selection block), and the above-described cell region may be defined as a tile.

The memory cell array 110 may include resistance-type memory cells or resistive memory cells that include a variable resistor device (not shown) having a variable resistor. As one example, when resistance of the variable resistor device that is formed of a phase change material (e.g., Ge—Sb—Te) is changed according to a temperature, a resistive memory device may be a phase change RAM (PRAM). As another example, when the variable resistor device is formed of complex metal oxide including an upper electrode, a lower electrode, and transition metal oxide therebetween, the resistive memory device may be a resistive RAM (RRAM). As another example, when the variable resistor device is formed of an upper electrode of a magnetic material, a lower electrode of the magnetic material, and a dielectric therebetween, the resistive memory device may be a magnetic RAM (MRAM). Hereinafter, for purposes of illustration, it will be assumed that the memory cell array 110 is an RRAM.

The write/read circuit 120 performs write and read operations on the memory cells. The write/read circuit 120 may include a write driver that is connected to the memory cells via the bit lines to data to the memory cells, and a sense amplifier that amplifies data read from the memory cells. The write/read circuit 120 provides a current pulse or a voltage pulse to a memory cell that is selected by a row decoder (not shown) and a column decoder (not shown) from among the memory cells, so as to perform the writing and reading operations on the selected memory cell.

The control logic 130 may control the write/read operations of the memory device 100. The control logic 130 may control the write/read circuit 120 for performing memory operations such as write or read operation. Also, the control logic 130 may control the voltage generator 140 so as to generate voltages used to perform the writing or reading operation of the memory device 100. The control logic 130 may adjust kinds of voltages or voltage levels of the voltages generated by the voltage generator, according to an operating mode of the memory device 100, for example, a set write mode, a reset write mode, or a read mode.

The voltage generator 140 may generate various voltages used in the memory device 100 under the control of the control logic 130. For example, the voltage generator 140 may generate bias voltages applied to the memory cell such as a set write voltage, a reset write voltage, a read voltage, and an inhibit voltage (or driving voltages) and power voltages for generating switching signals used in circuits of the row decoder and the column decoder (or switching voltages). Also, the voltage generator 140 may generate various reference voltages for changing writing condition or reading condition.

When performing a writing operation or a reading operation of the memory device 100, a bias voltage is applied to first signal lines and second signal lines that are connected to memory cells in order to select a memory cell, on which the writing operation or the reading operation is to be performed, from among the memory cells included in the memory cell array 110. For example, one of the set write voltage, the reset write voltage, and the read voltage is applied to selected signal lines, that is, signal lines connected to the selected memory cell, and the inhibit voltage is applied to the unselected signal lines. The bias voltages such as the set write voltage, the reset write voltage, the read voltage, and the inhibit voltage are applied via switches connected to the signal lines. In the present embodiment, the voltage generator 140 generates multiple switching voltages, and the switch is turned on in response to at least one of the switching voltages according to a voltage level of the bias voltage applied to each of the switches to apply the bias voltage to the corresponding signal line. Also, the voltage generator 140 may adjust the voltage level of the switching voltages according to an operating mode of the memory device 100.

In the present embodiment, the switch applying the bias voltage to the signal line includes at least two first conductive type metal oxide semiconductor (MOS) transistors that are connected to the same signal line, and the at least two first conductive type MOS transistors may be turned on in response to different switching voltages from each other. In the present embodiment, the at least two first conductive type MOS transistors may be NMOS transistors.

As described above, according to the embodiment of the inventive concept, the memory device 100 adjusts the voltage level of the bias voltage applied to the signal line and the voltage level of the switching voltages according to the operating mode of the memory device 100, so as to reduce the voltage level of the voltage applied to the switch. Accordingly, durability of the memory device 100 may be improved, and power consumption of the memory device 100 may be reduced.

In addition, the memory controller 200 and the memory device 100 may be integrated to a semiconductor device. For example, the memory controller 200 and the memory device 100 may be integrated to the semiconductor device and thus may configure a memory card. As one example, the memory controller 200 and the memory device 100 may be integrated to the semiconductor device and thus may configure a PC card (a PCMCIA card), a compact flash card (CF card), a smart media card (SM/SMC), a memory stick, a multimedia card (MMC, RS-MMC, or MMCmicro, a secure digital (SD) card (SD, miniSD, or microSD), or universal flash storage (UFS). As another example, the memory controller 200 and the memory device 100 may be integrated to the semiconductor device and thus may configure a Solid State Disk/Drive (SSD).

An operation of the memory device 100 included in the resistive memory system 1 with the aforementioned structure will be described below.

Figure 2:
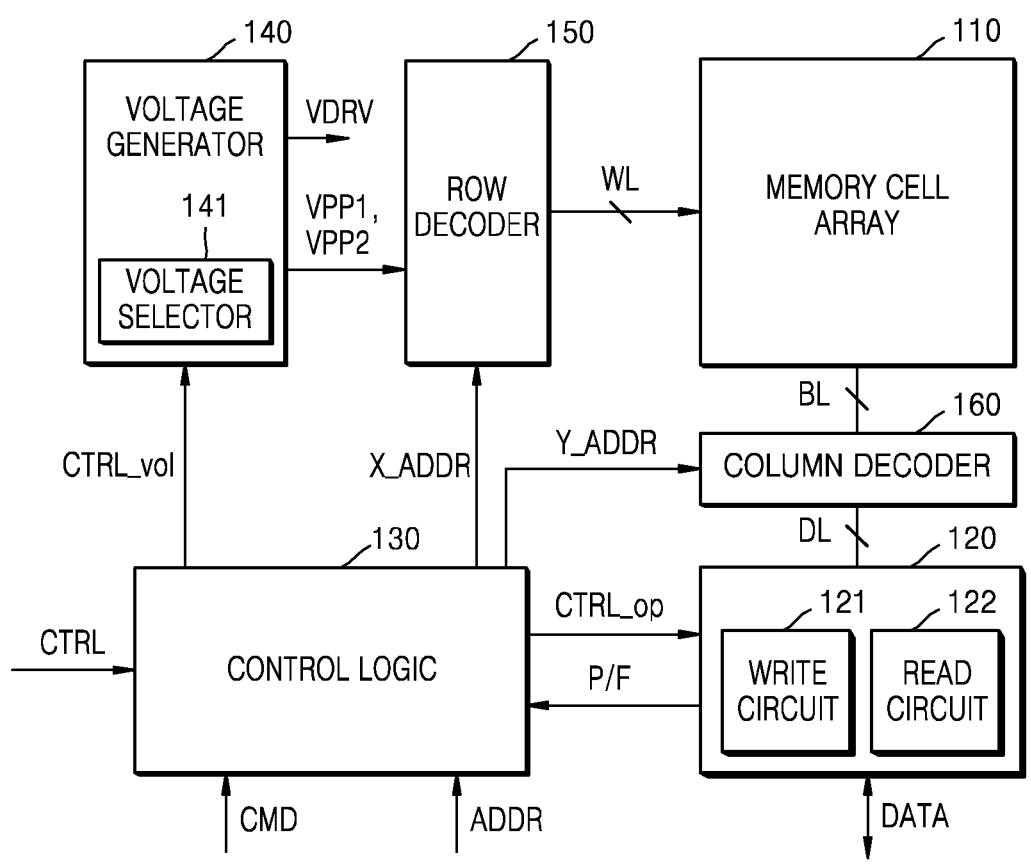
FIG. 2 is a block diagram of an example of the memory device of FIG. 1.

FIG. 2 is a block diagram of the memory device 100 of FIG. 1, according to an exemplary embodiment of the inventive concept.

Referring to FIG. 2, the memory device 100 includes the memory cell array 110, the write/read circuit 120, the control logic 130, and the voltage generator 140. Also, the memory device 100 may includes a row decoder 150 and a column decoder 160. The write/read circuit 120 includes a write circuit 121 and a read circuit 122.

The memory cell array 110 may be connected to multiple first signal lines and multiple second signal lines. Also, the memory cell array 110 may include memory cells that are respectively arranged in regions where the first signal lines and the second signal lines cross each other. Hereinafter, it is assumed that the first signal lines are bit lines BL, and the second signal lines are word lines WL.

An address ADDR for indicating a memory cell to be accessed may be received with a command CMD, and the address ADDR may include a row address X_ADDR for selecting word lines WL of the memory cell array 110 and a column address Y_ADDR for selecting a bit line BL of the memory cell array 110. The row decoder 150 is connected to the memory cell array 110 via the word lines WL, and may select at least one of the word lines WL in response to the row address X_ADDR. The column decoder 160 is connected to the memory cell array 110 via the bit lines BL, and may select at least one of the bit lines BL in response to the column address Y_ADDR.

The write/read circuit 120 may write data DATA input from outside in the memory cell array 110, or may sense and output the data written in the memory cell array 110, according to control of the control logic 130. Also, the write/read circuit 120 may provide the control logic 130 with the writing or reading result. For example, the write/read circuit 120 may perform a verification operation for detecting a result of the writing operation and may provide the control logic 130 with the verification result, for example, a pass or fail (P/F) signal.

The write/read circuit 120 may be selectively connected to the row decoder 150 or the column decoder 160, and accordingly, is selectively connected to the word lines WL or the bit lines BL to write data in the memory cell or to read data from the memory cell.

The write/read circuit 120 includes the write circuit 121 and the read circuit 122. The write circuit 121 is connected to the selected bit line BL via the column decoder 160 to provide the selected memory cell MC with a programming pulse to perform the programming operation (that is, the writing operation). Accordingly, the data DATA to be stored in the memory cell array 110 may be written. Here, the programming pulse may be referred to as a write pulse. In an embodiment of the inventive concept, the programming pulse may be a current pulse, and in another embodiment, the programming pulse may be a voltage pulse.

In particular, the write circuit 121 may perform a set writing operation for programming the memory cell MC so that a resistance of the memory cell MC is reduced. Also, the write circuit 121 may perform a reset writing operation for programming the memory cell MC so that a resistance of the memory cell MC is increased.

The write circuit 122 is connected to the selected bit line BL via the column decoder 160, and may sense a resistance level of the selected memory cell MC to read the stored data DATA. As such, the data DATA stored in the memory cell array 110 may be output.

In particular, the read circuit 122 may perform a general reading operation on a memory cell MC, if a read command is transmitted from the memory controller 200. Also, the read circuit 122 may perform a pre-reading operation, that is, perform a reading operation on the memory cell MC before performing the writing operation on the memory cell MC to read an initial resistance state of the memory cell MC.

Moreover, the read circuit 122 may perform a verifying read operation for determining whether the writing operation on the memory cell MC is finished, after performing the writing operation on the memory cell MC.

In a case of the general reading operation, the read circuit 122 may provide the read data DATA to outside of the memory device, for example, to the memory controller 200. Also, in a case of the pre-read operation and the verifying read operation, the read circuit 122 may provide the read data DATA or a pass/fail P/F signal indicating whether the writing/reading operation has succeeded to the inside of the memory device 100, for example, to the control logic 130 or the write circuit 121, as a result of the writing/reading operations.

In the present embodiment, the write circuit 121 and the read circuit 122 may be connected to the word line WL. In another embodiment, the write circuit 121 and the read circuit 122 may be connected to the bit line BL. In another embodiment, the write circuit 121 may be connected to the word line WL and the read circuit 122 may be connected to the bit line BL. In another embodiment, the write circuit 121 may be connected to the bit line BL and the read circuit 122 may be connected to the word line WL.

The voltage generator 140 may generate various types of voltages for performing the writing, reading, and erasing operations on the memory cell array 110 based on a voltage control signal CTRL_vol. The voltage generator 140 may generate a driving voltage (VDRV) (or bias voltage) for driving the word lines WL and the bit lines BL, for example, the set write voltage Vset, the reset write voltage Vreset, the read voltage Vread, and inhibit voltages Vinh.

The voltage generator 140 may generate plurality of switching voltages, for example, first and second voltages VPP1 and VPP2, provided to switches included in the row decoder 150 or the column decoder 160. The voltage generator 140 may change voltage levels of the switching voltages according to the operating mode of the memory device 100, for example, a set writing mode, a reset writing mode, or a reading mode. To do this, the voltage generator 140 includes a voltage selector 141. The voltage selector 141 may select the first voltage VPP1 or the second voltage VPP2, and output the selected voltage, from among the multiple voltages generated the voltage generator 140 or voltages applied from outside, according to the operating mode of the memory device 100. Accordingly, the voltage levels of the switching voltages may vary depending on the operating mode of the memory device 100. However, one or more embodiments of the inventive concept are not limited thereto. The voltage generator 140 may generate the first voltage VPP1 and the second voltage VPP2 of desired voltage levels, according to the operating mode of the memory device 100.

The row decoder 150 or the column decoder 160 may generate a switching signal for controlling the switches included therein by using the plurality of switching voltages provided from the voltage generator 140, for example, the first voltage VPP1 and the second voltage VPP2. This will be described in more detail below with reference to FIGS. 8A to 14.

The control logic 130 may output various control signals for writing the data DATA in the memory cell array 110 or reading the data DATA from the memory cell array 110 based on the command CMD, the address ADDR, and the control signal CTRL transmitted from the memory controller 200. The various control signals output from the control logic 130 may be provided to the write/read circuit 120, the voltage generator 140, the row decoder 150, and the column decoder 160. Accordingly, the control logic 130 may control overall operations in the memory device 100.

In particular, the control logic 130 may generate operation control signals CTRL_op based on the command CMD and the control signal CTRL, and may provide the operation control signals CTRL_op to the write/read circuit 120.

Moreover, the control logic 130 may provide the row decoder 150 with the row address X_ADDR, and may provide the column decoder 160 with the column address Y_ADDR.

Also, the control logic 130 may generate a voltage control signal CTRL_vol based on the command CMD, the control signal CTRL, and the P/F signal transmitted from the read circuit 122. For example, the voltage control signal CTRL_vol may include signals representing the operating mode of the memory device 100 and signals for controlling voltage levels of the voltages generated by the voltage generator 140. The control logic 130 may provide the generated voltage control signal CTRL_vol to the voltage generator 140.

Figure 3:
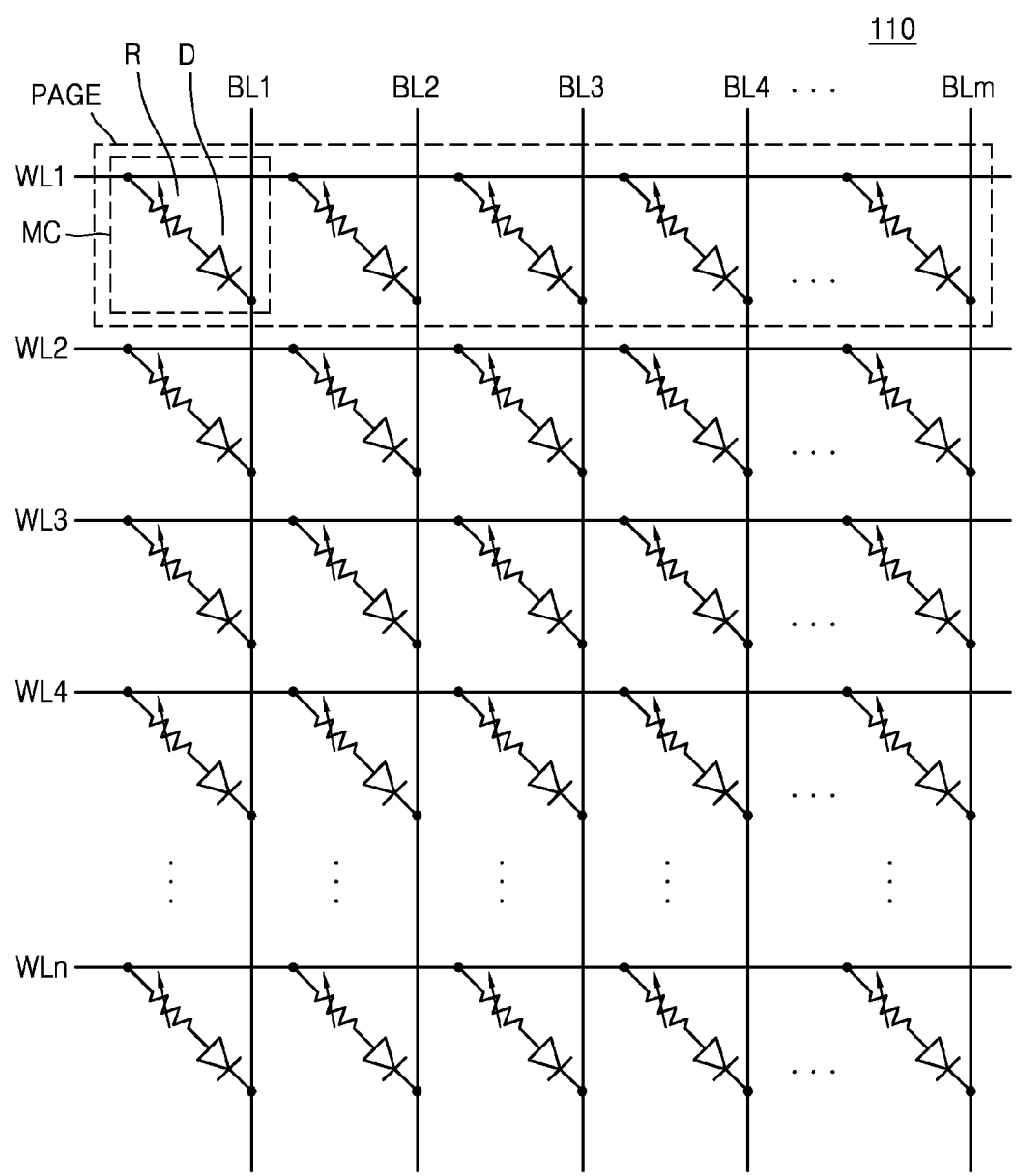
FIG. 3 is a detailed circuit diagram of a memory cell array of FIG. 2.

FIG. 3 is a circuit diagram of an example of the memory cell array 110 of FIG. 2, according to an exemplary embodiment of the inventive concept. The memory cell array 110 may include a plurality of memory blocks, and FIG. 3 shows one representative memory block of the plurality of memory blocks.

Referring to FIG. 3, the memory cell array 110 includes the memory cells of a horizontal structure. The memory cell array 110 may include word lines WL1 through WLn, bit lines BL1 through BLm, and memory cells MCs. A group of the memory cells MC selected by the same word line WL may be defined as a page PAGE. Here, the number of word lines WL, the number of bit lines BL, and the number of memory cells MC may vary depending on exemplary embodiments, without departing from the scope of the present teachings. FIG. 3 shows a two-dimensional memory of a horizontal structure, but one or more embodiments of the inventive concept are not limited thereto. That is, the memory cell array 110 may be a three-dimensional memory of a vertical structure, for example, according to another embodiment.

According to the present exemplary embodiment, each of the memory cells MC may include a variable resistive device R and a selection device D. Here, the variable resistance device R may be referred to as a variable resistance material, and the selection device D may be referred to as a switching device.

In the present exemplary embodiment, the variable resistance device R is connected between one of the word lines WL1 through WLn and the selection device D, and the selection device D is connected between the variable resistance device R and one of the bit lines BL1 through BLm. However, the one or more exemplary embodiments of the present inventive concept are not limited thereto. That is, the selection device D may be connected between one of the word lines WL1 through WLn and the variable resistance device R, and the variable resistance device R may be connected between the selection device D and one of the bit lines BL1 through BLm.

According to the present exemplary embodiment, the variable resistance device R may be switched to one of multiple resistance states by an electric pulse applied thereto. In the present exemplary embodiment, the variable resistance device R may include a phase-change material, a crystallization status of which varies depending on an amount of electric current. The phase-change material may vary, and may be, for example, GaSb, InSb, InSe, $Sb_2Te_3$, or GeTe, which are compounds of two elements, GeSbTe, GaSeTe, InSbTe, $SnSb_2Te_4$, or InSbGe, which are compounds of three elements, and AgInSbTe, (GeSn)SbTe, GeSb(SeTe), or $Te_{81}Ge_{15}Sb_2S_2$, which are compounds of four elements.

The phase-change material may have an amorphous state having a relatively high resistance and a crystalline state having a relatively low resistance. The phase of the phase-change material may be changed by Joule's heat generated according to the amount of electric current. In addition, the data may be written by using the phase change.

In addition, according to another exemplary embodiment of the present inventive concept, the variable resistance device R may include perovskite compounds, transmission metal oxide, magnetic materials, ferromagnetic materials, or antiferromagnetic materials, instead of the phase-change material.

The selection device D may be connected between one of the word lines WL1 through WLn, and the variable resistance material R, and may control supply of the electric current to the variable resistance device R according to a voltage applied to the connected word line and the bit line. In the present exemplary embodiment, the selection device D may be a PN junction diode or a PIN junction diode, for example. An anode of the diode may be connected to the variable resistance device R and a cathode of the diode may be connected to one of the word lines WL1 through WLn. Here, when a voltage difference between the anode and the cathode of the diode becomes greater than a threshold voltage of the diode, the diode is turned on so as to supply the electric current to the variable resistance device R. In FIG. 3, the selection device D is shown as a diode; however, one or more exemplary embodiments of the inventive concept are not limited thereto. That is, the selection device D may be another device that may be switched, without departing from the scope of the present teachings.

Figure 4:
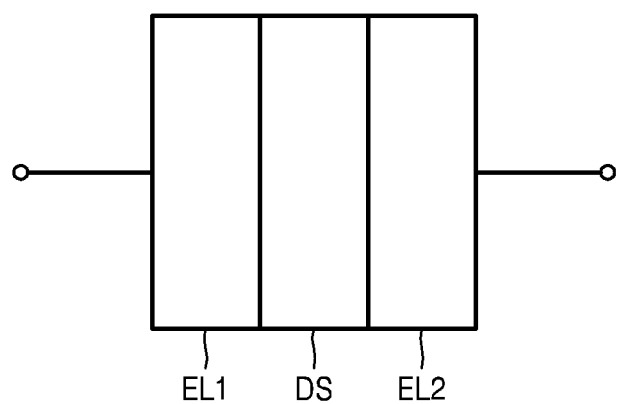
FIG. 4 is a diagram of an example of a variable resistor device included in a memory cell of FIG. 3.

FIG. 4 is a diagram of the variable resistance device R included in the memory cell MC of FIG. 3, according to an exemplary embodiment of the inventive concept.

Referring to FIG. 4, the variable resistance device R includes first and second electrodes EL1 and EL2, and a data storage film DS disposed between the first and second electrodes EL1 and EL2.

The first and second electrodes EL1 and EL2 may be formed of various metals, metal oxides, or metal nitrides. For example, the first and second electrodes EL1 and EL2 may be formed of aluminium (Al), copper (Cu), titanium nitride (TiN), titanium aluminium nitride (TixAlyNz), iridium (Ir), platinum (Pt), silver (Ag), gold (Au), poly silicon, tungsten (W), titanium (Ti), tantalum (Ta), tantalum nitride (TaN), tungsten nitride (WN), nickel (Ni), cobalt (Co), chrome (Cr), antimony (Sb), iron (Fe), molybdenum (Mo), palladium (Pd), tin (Sn), zirconia (Zr), zinc (Zn), iridium oxide ($IrO_2$), or strontium zirconate oxide ($StZrO_3$).

The data storage film DS may be a bipolar resistive memory material or a unipolar resistive memory material. The bipolar resistive memory material may be programmed as a set state or a reset state according to a polarity of the pulse, and the unipolar resistive memory material may be a perovskite-based material. In addition, the unipolar resistive memory material may be programmed as a set state or a reset state according to the pulses of the same polarity, and the unipolar resistive memory material may be a transition metal oxide such as NiOx or TiOx.

Figure 5A:
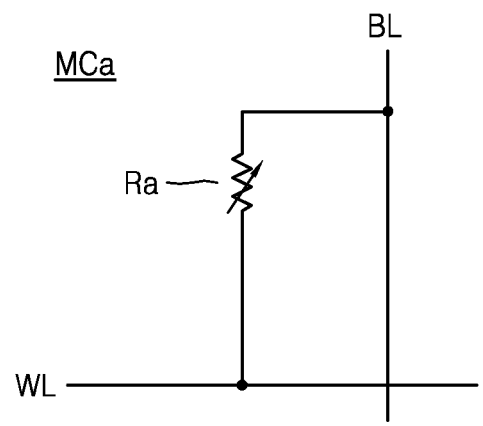
FIGS. 5A through 5C are circuit diagrams showing modified examples the memory cell of FIG. 3.
Figure 5B:
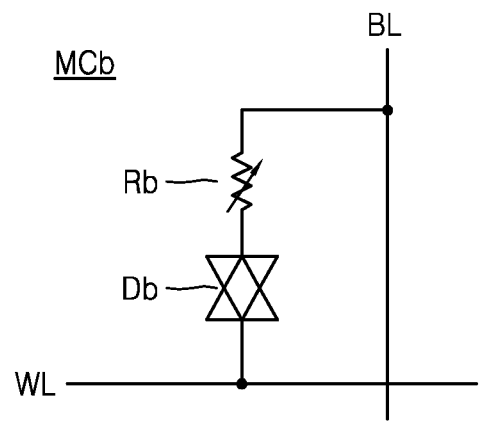
Figure 5C:
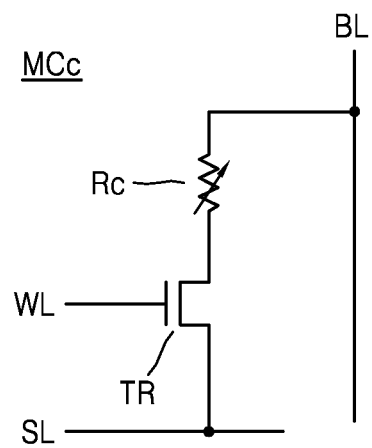

FIGS. 5A through 5C are circuit diagrams showing modified examples of the memory cell MC shown in FIG. 3.

Referring to FIG. 5A, a memory cell MCa includes a variable resistance device Ra, and the variable resistance device Ra may be connected between a bit line BL and a word line WL. The memory cell MCa may store data by using voltages applied to the bit line BL and the word line WL.

Referring to FIG. 5B, a memory cell MCb includes a variable resistance device Rb and a bidirectional diode Db. The variable resistance device Rb may include a resistor material for storing data. The bidirectional diode Db is connected between the variable resistance device Rb and the word line WL, and the variable resistance device Rb is connected between the bit line BL and the bidirectional diode Db. The respective locations of the bidirectional diode Db and the variable resistance device Rb may be exchanged. A leakage current flowing in non-selected resistor cells may be blocked by the bidirectional diode Db.

Referring to FIG. 5C, a memory cell MCc includes a variable resistance device Rc and a transistor TR. The transistor TR may be a selection device for supplying or blocking the electric current to the variable resistance device Rc according to a voltage of the word line WL, that is, a switching device. The transistor TR is connected between the variable resistance device Rc and the source line SL, and the variable resistance device Rc is connected between the bit line BL and the transistor TR. The respective locations of the transistor TR and the variable resistance device Rc may be exchanged. The memory cell MCc may be selected or not be selected according to turning on/turning off the transistor TR, which is driven by the word line WL.

Figure 6A:
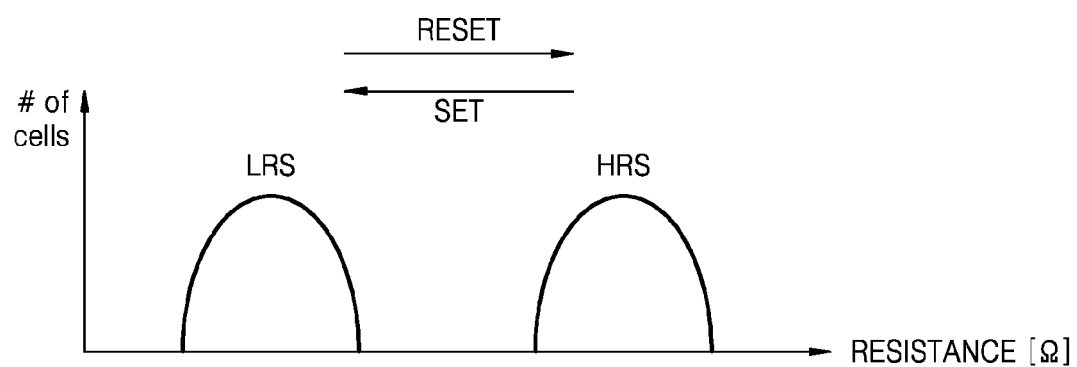
FIGS. 6A and 6B are graphs of resistance distribution of memory cells.
Figure 6B:
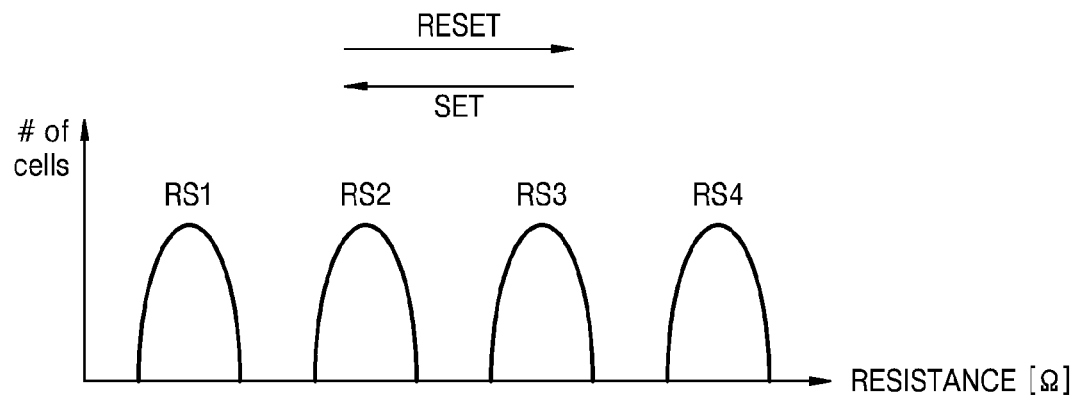

FIGS. 6A and 6B are graphs showing resistance distributions in the memory cells MC. FIG. 6A shows a case in which the memory cell MC is an SLC, and FIG. 6B shows a case in which the memory cell MC is an MLC. In each of FIGS. 6A and 6B, the horizontal axis indicates resistance, and the vertical axis indicates the number of memory cells MC.

Referring to FIG. 6A, when the memory cell MC is a single level cell SLC programmed with one bit, the memory cell MC may have a low resistance state LRS or a high resistance state HRS. The low resistance state LRS may be referred to as a set state, and the high resistance state HRS may be referred to as a reset state.

An operation of switching the HRS to the LRS of the memory cell MC by applying a write pulse to the memory cell MC is a set operation or a set writing operation. An operation of switching the MC from the LRS to the HRS by applying a write pulse to the memory cell MC is a reset operation or a reset writing operation.

The low resistance state LRS and the high resistance state HRS may respectively correspond to one of data "0" and data "1". In the present exemplary embodiment, the resistance level R may increase from data "0" to data "1". The low resistance state LRS may correspond to data "0" and the high resistance state HRS may correspond to data "1".

An operation of applying a write pulse to the memory cell MC to switch the memory cell MC from the high resistance state HRS to the low resistance state LRS is referred to as a set operation or a set writing operation. Also, an operation of applying a write pulse to the memory cell MC to switch the memory cell MC from the low resistance state LRS to the high resistance state HRS is referred to as a reset operation or a reset writing operation.

Referring to FIG. 6B, when the memory cell MC is an MLC that is programmed with two bits, the memory cell MC may have one of a first resistance state RS1, a second resistance state RS2, a third resistance state RS3, and a fourth resistance state RS4.

However, embodiments of the present inventive concept are not limited thereto, that is, memory cells may include triple level cells (TLCs) storing data of 3 bits, and accordingly, each of the memory cells may have one of eight resistance states. In another embodiment, the memory cells may include memory cells, each storing data of 4 bits or greater.

When comparing the MLC with the SLC, the MLC has narrower intervals between resistance distributions, and thus reading errors may be more likely to occur due to small changes in the resistance in the MLC. Therefore, first, second, third, and fourth resistance states RS1, RS2, RS3, and RS4 may respectively have resistor ranges that do not overlap with each other in order to ensure a read margin.

Each of the first, second, third, and fourth resistance states RS1, RS2, RS3, and RS4 may correspond to one of data "00", data "01", data "10", and data "11". In the present embodiment, a resistance level R may increase in order of the data "11", the data "01", the data "00", and the data "10". That is, the first resistance state RS1 may correspond to the data "11", the second resistance state RS2 may correspond to the data "01", the third resistance state RS3 may correspond to the data "00", and the fourth resistance state RS4 may correspond to the data "10".

Figure 7:
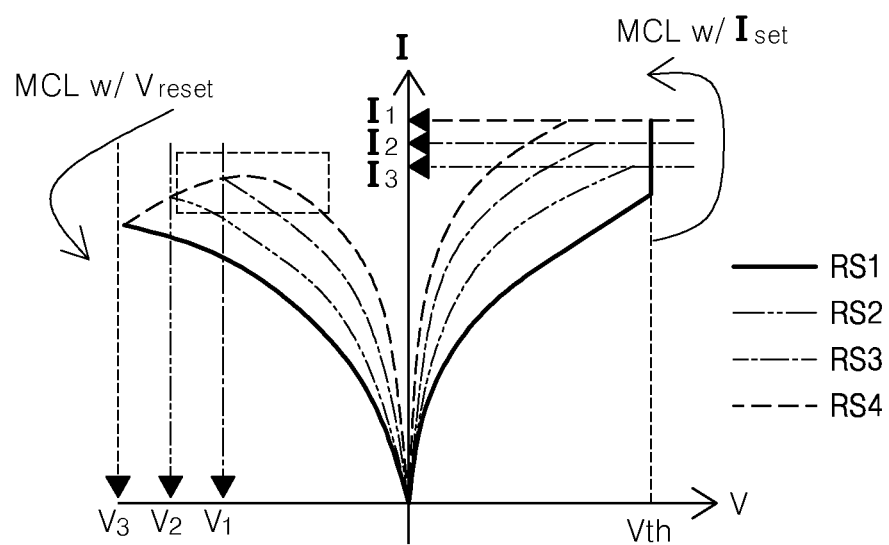
FIG. 7 is a graph of a voltage-current characteristic of a memory cell.

FIG. 7 is a graph showing a voltage-current characteristic curve of a memory cell MC.

Referring to FIG. 7, the horizontal axis denotes the voltage V, and the vertical axis denotes the current I. When the memory cell MC is an MLC, the memory cell MC may have one of the resistance states according to data stored therein. For example, as shown in FIG. 7, the memory cell MC may have one of the first through fourth resistance states RS1, RS2, RS3, and RS4. Here, the resistance level is the largest when the memory cell MC is in the first resistance state RS1, and the resistance level is the smallest when the memory cell MC is in the fourth resistance state RS4.

As shown in right side of the graph of FIG. 7, the resistance level of the memory cell MC may be reduced through the set writing operation. On the contrary, as shown in left side of the graph, the resistance level of the memory cell MC may be increased through the reset writing operation.

When a voltage that is equal to or greater than a threshold voltage Vth is applied to the memory cell MC, the current in the memory cell MC is rapidly increased. Thus, it is not easy to control the current for writing the resistance level according to the data to be programmed. Therefore, in the present exemplary embodiment, when performing the set writing operation on the memory cell MC, a write current Iset or a write current pulse may be applied to the memory cell MC.

Since the set write current Iset or the set write current pulse is applied to the memory cell MC, the resistance state of the memory cell MC may be switched from the current resistance state to a relatively higher resistance state. A degree of changing the resistance state of the memory cell MC may vary depending on the magnitude of the set write current Iset or the set write current pulse. For example, as shown in FIG. 7, the memory cell MC may be switched from the first resistance state RS1 to one of the second through fourth resistance states RS2, RS3, and RS4 according to the change in a magnitude of the set write current Iset or the set write pulse.

In addition, in order to perform the reset writing operation, the current applied to the memory cell MC has to be adjusted to increase to a peak (denoted as a dashed box in FIG. 7) and decrease, and thus, it is not easy to perform the reset writing operation on the memory cell MC by using a general square pulse. Therefore, in the present exemplary embodiment, a write voltage pulse Vreset may be applied to the memory cell MC when performing the reset writing operation on the memory cell MC.

Since the reset write voltage Vreset or a reset write voltage pulse is applied to the memory cell MC, the resistance state of the memory cell MC may be switched from the current resistance state to a relatively lower resistance state. A degree of changing the resistance state of the memory cell MC may vary depending on a magnitude of the reset write voltage Vreset or the reset write voltage pulse. For example, as shown in FIG. 7, the memory cell MC may be switched from the fourth resistance state RS4 to one of the first through third resistance states RS1, RS2, and RS3, according to change in the reset write voltage Vreset or a reset write voltage pulse.

Figure 8A:
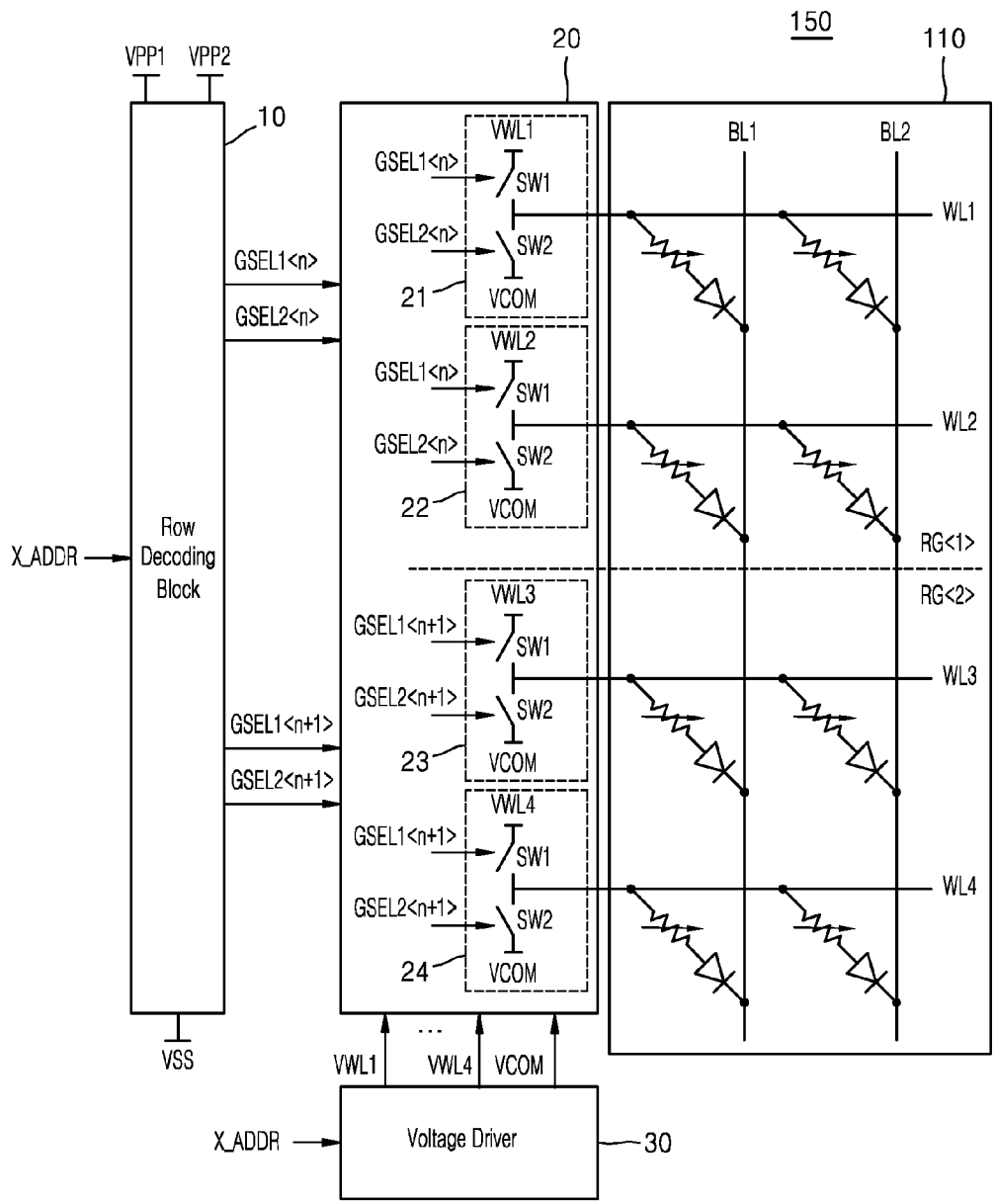
FIG. 8A is a circuit diagram of a row decoder according to an exemplary embodiment of the inventive concept.
Figure 8B:
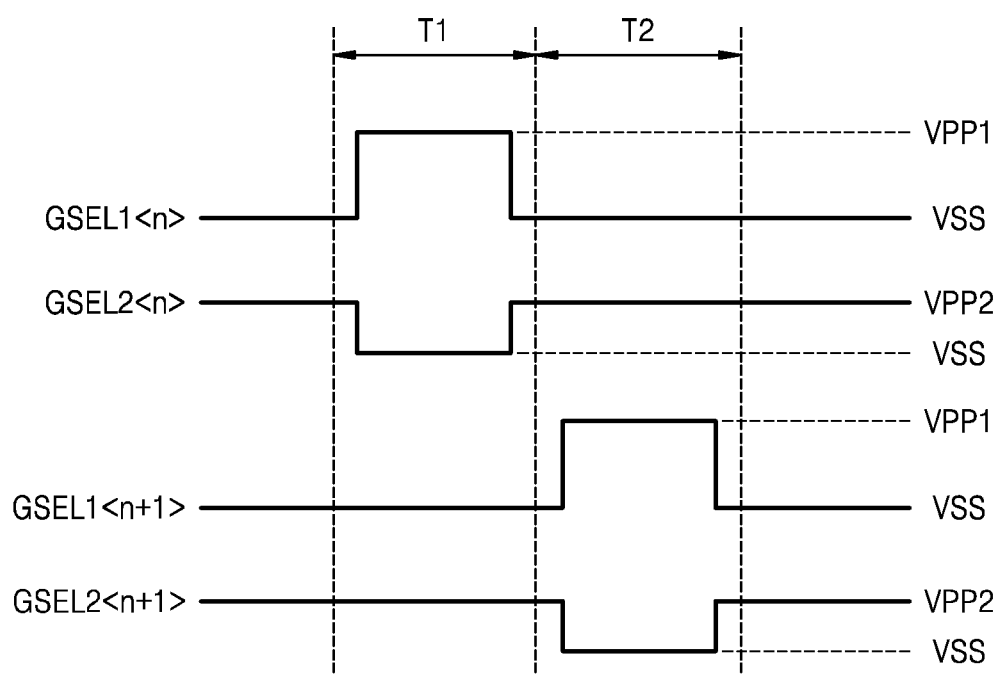
FIG. 8B is a graph showing waveforms of switching signals of the row decoder of FIG. 8A.

FIG. 8A is a schematic circuit diagram of a row decoder 150, according to an embodiment of the inventive concept. For convenience of description, the memory cell array 110 is also shown in FIG. 8A. FIG. 8B is a graph showing waveforms of switching signals of the row decoder 150 of FIG. 8A.

Referring to FIG. 8A, the row decoder 150 may include a row decoding block 10, a row switch block 20, and a voltage driver 30.

The row switch block 20 may select at least one of the word lines WL1 to WL4 connected to the memory cells, in response to switching signals GSEL1<n>, GSEL2<n>, GSEL1<n+1>, and GSEL2<n+1>. The row switch block 20 may apply a voltage for writing and reading operations to the word line connected to the memory cell, on which the writing or reading operation is to be performed, in response to the switching signals GSEL1<n>, GSEL2<n>, GSEL1<n+1>, and GSEL2<n+1>, and may apply inhibit voltages to the other word lines for preventing leakage current. In the present embodiment, one of the word lines WL1 to WL4 may be selected.

The row switch block 20 includes row selection switch units 21 to 24 that are respectively connected to the word lines WL1 to WL4. Each of the row selection switch units 21 to 24 may include at least two switches SW1 and SW2, that is, a first switch SW1 and a second switch SW2. In the present embodiment, the at least two switches SW1 and SW2 may include MOS transistors of the same conductive type. For example, the first switch SW1 and the second switch SW2 may be NMOS transistors or may each include an NMOS transistor. As another example, the first switch SW1 and the second switch SW2 may be PMOS transistors or may each include a PMOS transistor.

The first switch SW1 and the second switch SW2 may operate in response to different switching signals. For example, the first switch SW1 may operate in response to first switching signals GSEL1<n>, and GSEL1<n+1> and the second switch SW2 may operate in response to second switching signals GSEL2<n> and GSEL2<n+1>. Here, as shown in FIG. 8B, the first switching signal and the second switching signal corresponding to each other, for example, the first switching signal GSEL1<n> and the second switching signal GSEL2<n>, and the first switching signal GSEL1<n+1> and the second switching signal GSEL2<n+1> may be the signals of opposite phases. Accordingly, the first switch SW1 and the second switch SW2 may be turned on or turned off to be complementary with each other. Also, the first switching signals GSEL1<n> and GSEL1<n+1> and the second switching signals GSEL2<n> and GSEL2<n+1> may have different voltage levels in activated states. The activated state of the switching signal may denote a status of the switching signal when the switch controlled by the switching signal is turned on.

In addition, the first switch SW1 is turned on in response to the first switching signals GSEL1<n> and GSEL1<n+1> to provide individual driving voltages VWL1 to VWL4 respectively to the word lines WL1 to WL4. Here, the individual driving voltage VWL1 to VWL4 may be one of the set write voltage, the ground voltage, the read voltage, or the inhibit voltage, and the first switch SW1 included in at least one of the row selection switch units 21 to 24 may provide one of the set write voltage, the ground voltage, and the read voltage as the individual driving voltage. For example, when the memory device (100 of FIG. 1) performs a set writing operation and the first word line WL1 is selected, the individual driving voltage VWL1 applied to the first switch SW1 connected to the first word line WL1 is the set write voltage, and the individual driving voltages VWL2 to VWL4 applied to the other word lines WL2 to WL4 may be inhibit voltages.

The second switch SW2 is turned on in response to the second switching signals GSEL2<n> and GSEL2<n+1> to apply a common voltage VCOM to each of the word lines WL1 to WL4. Here, the common voltage VCOM may be the inhibit voltage.

In the present embodiment, the memory cell array 110 may include multiple regions. In FIG. 8A, a first region RG<1> and a second region RG<2> are shown for convenience of description, although in alternative configurations, the memory cell array 110 may include three or more regions. At least one of the regions, that is, the first and second regions RG<1> and RG<2>, may include the selected memory cell. The row selection switch units corresponding to the same region among the regions RG<1> and RG<2> may operate in response to the same first or second switching signals. For example, the first row selection switch unit 21 and the second row selection switch unit 22 corresponding to the first region RG<1> operate in response to the first switching signal GSEL1<n> and the second switching signal GSEL2<n>, and the third row selection switch unit 23 and the fourth row selection switch unit 24 corresponding to the second region RG<2> operate in response to the first switching signal GSEL1<n+1> and the second switching signal GSEL2<n+1>.

In addition, the voltage levels of the first and second switching signals GSEL1<n>, GSEL1<n+1>, GSEL2<n>, and GSEL2<n+1> that control turning on/turning off of the first and second switches SW1 and SW2, respectively, may be set based on the voltage level of the voltages provided by the first and second switches SW1 and SW2, so that the first and second switches SW1 and SW2 may operate normally. As described above, the at least one first switch SW1 provides one of the set write voltage, the ground voltage, and the read voltage to the word lines WL1 to WL4 as the individual driving voltage, and the second switch SW2 provides the common voltage, for example, the inhibit voltage, to the word lines WL1 to WL4. In the present embodiment, since the voltage levels of the set write voltage, the ground voltage, and the read voltage and the inhibit voltage are different from each other, the voltage levels of the first switching signals GSEL1<n> and GSEL1<n+1> and the voltage levels of the second switching signals GSEL2<n> and GSEL2<n+1> may be different from each other. The voltage level of the first switching signals GSEL1<n> and GSEL1<n+1> in the activated states may be set based on the voltage level of one of the set write voltage, the ground voltage, and the read voltage, according to an operating mode of the memory device 100. Also, the voltage levels of the second switching signals GSEL2<n> and GSEL2<n+1> may be set based on the voltage level of the inhibit voltage according to the operating mode of the memory device 100.

The row decoding block 10 receives the row address X_ADDR, and generates the first switching signals GSEL1<n> and GSEL1<n+1> and the second switching signals GSEL2<n> and GSEL2<n+1> for selecting at least one of the word lines WL1 to WL4 based on the row address X_ADDR.

The row decoding block 10 generates the first switching signals GSEL1<n> and GSEL1<n+1> and the second switching signals GSEL2<n> and GSEL2<n+1>. As described above, the first and second switching signals corresponding to each other from among the multiple first switching signals GSEL1<n> and GSEL1<n+1> and the multiple second switching signals GSEL2<n> and GSEL2<n+1>, for example, the first switching signal GSEL1<n> and the second switching signal GSEL2<n>, and the first switching signal GSEL1<n+1> and the second switching signal GSEL2<n+1> have opposite phases and different voltage levels in activated states.

In addition, the row decoding block 10 may generate the first switching signals GSEL1<n> and GSEL1<n+1> and the second switching signals GSEL2<n> and GSEL2<n+1> based on the first voltage VPP1, the second voltage VPP2, and a third voltage VSS applied thereto. Accordingly, as shown in FIG. 8B, the first switching signals GSEL1<n> and GSEL1<n+1> are transitioned between the first voltage VPP1 and the third voltage VSS, and the second switching signals GSEL1<n+1> and GSEL2<n+1> are transitioned between the second voltage VPP2 and the third voltage VSS.

For example, the voltage of the first switching signals GSEL1<n> and GSEL1<n+1> in the activated states may be the first voltage VPP1, and the voltage of the second switching signals GSEL2<n> and GSEL2<n+1> in the activated states may be the second voltage VPP2. The voltage of the first and second switching signals GSEL1<n>, GSEL1<n+1>, GSEL1<n+1>, and GSEL2<n+1> in inactivated states may be the third voltage VSS. Here, the third voltage VSS may be ground voltage, for example. In the present embodiment, the voltage level of at least one of the first and second voltages VPP1 and VPP2 may vary depending on the operating mode of the memory device 100.

The voltage driver 30 may provide the individual driving voltages VWL1 to VWL4 and the common voltage VCOM to the row selection switch units 21 to 24. The voltage driver 30 may provide the individual driving voltages VWL1 to VWL4 corresponding respectively to the word lines WL1 to WL4 to the first switches SW1 based on the row address X_ADDR, and may provide the common voltage VCOM to the second switches SW2. As described above, the individual driving voltages VWL1 to VWL4 may be one of the set write voltage, the ground voltage, the read voltage, and the inhibit voltage.

The first and second switching signals GSEL1<n>, GSEL2<n>, GSEL1<n+1>, and GSEL2<n+1> will be described in more detail with reference to FIG. 8B. In FIG. 8B, one of the memory cells included in the first region RG<1> of the memory cell array 110 is selected for the writing or the reading operation in a section T1, and one of the memory cells included in the second region RG<2> is selected for the writing or the reading operation in a section T2.

In the section T1, the first switching signal GSEL1<n> is activated to the voltage level of the first voltage VPP1, and the second switching signal GSEL2<n> is inactivated to the voltage level of the third voltage VSS, e.g., the ground voltage. Also, the first switching signal GSEL1<n+1> is inactivated to the voltage level of the third voltage VSS, and the second switching signal GSEL2<n+1> is activated to the voltage level of the second voltage VPP2. Accordingly, the first switches SW1 of the row selection switch units 21 and 22 corresponding to the first region RG<1> are turned on to provide the individual driving voltages to the word lines WL1 and WL2 included in the first region RG<1>. In addition, the second switches SW2 of the row selection switch units 23 and 24 corresponding to the second region RG<2> provide the common voltage, for example, the inhibit voltage, to the word lines WL3 and WL4 included in the second region RG<2>. Accordingly, the set write voltage, the ground voltage, or the read voltage may be applied to the at least one word line in the first region RG<1>, and the inhibit voltage may be applied to the other word lines.

In the section T2, the first switching signal GSEL1<n> is inactivated to the voltage level of the third voltage VSS, and the second switching signal GSEL2<n> is activated to the voltage level of the second voltage VPP2. Also, the first switching signal GSEL1<n+1> is activated to the voltage level of the first voltage VPP1 and the second switching signal GSEL2<n+1> is inactivated to the voltage level of the third voltage VSS. Accordingly, the second switches SW2 of the row selection switch units 21 and 22 corresponding to the first region RG<1> are turned on to provide the inhibit voltage to the word lines WL1 and WL2 included in the first region RG<1>, and the first switches SW1 of the row selection switch units 23 and 24 corresponding to the second region RG<2> are turned on to provide the individual driving voltages to the word lines WL3 and WL4 included in the second region RG<2>. Accordingly, the set write voltage, the ground voltage, or the read voltage is provided to the at least one word line in the second region RG<2>, and the inhibit voltage may be applied to the other word lines.

As described above, the row decoder 150 of the present embodiment may adjust the voltage level of the switching signal that controls the switch, based on the voltage level of the voltage provided by the switch. Accordingly, application of excessive voltage to each of the switches may be prevented, and thus, durability of the memory device 100 may be improved. Also, the power consumption of the memory device 100 may be reduced.

Figure 9A:
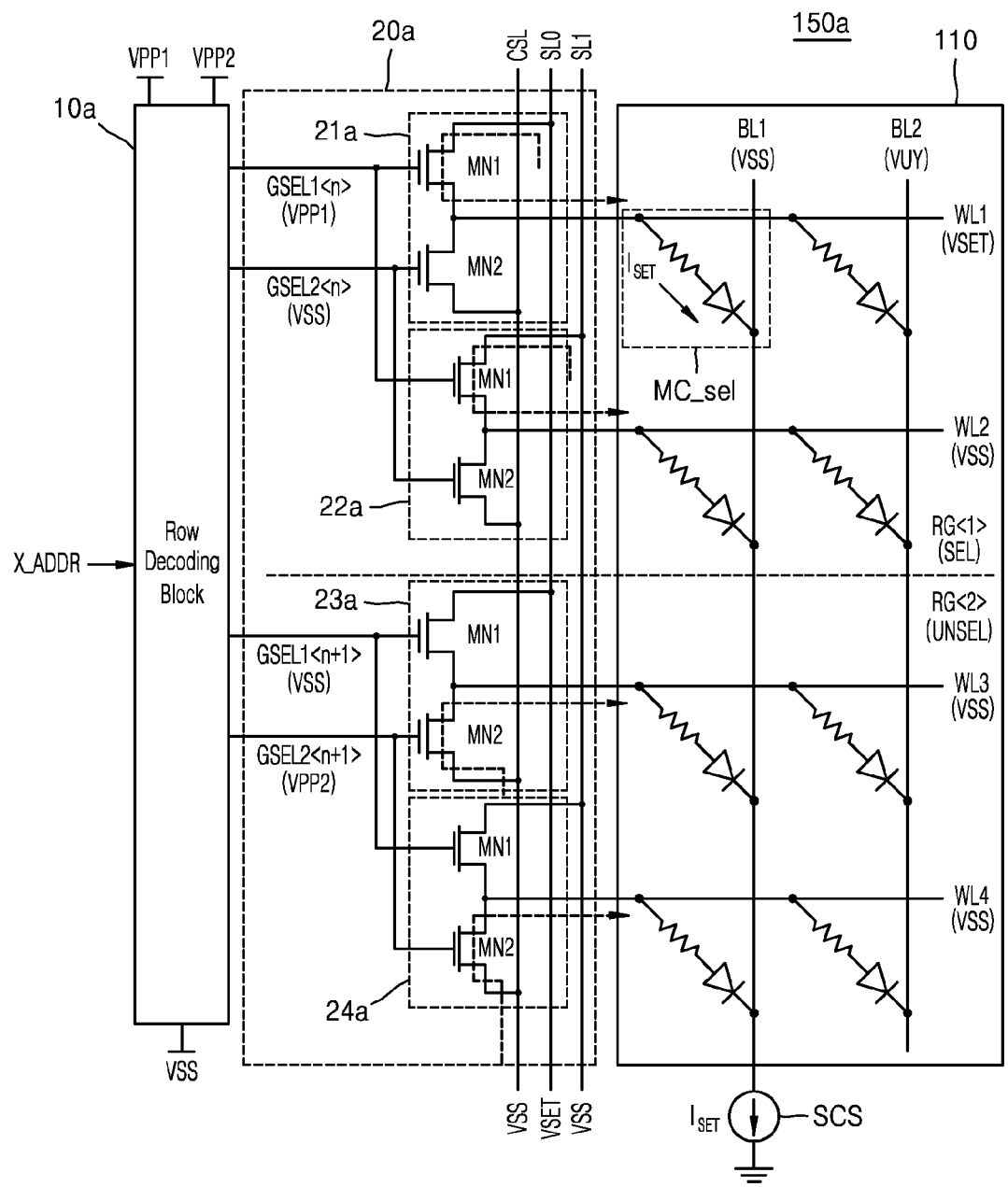
FIGS. 9A and 9B are diagrams showing operations of the row decoder, when a set writing operation is performed on a memory device.
Figure 9B:
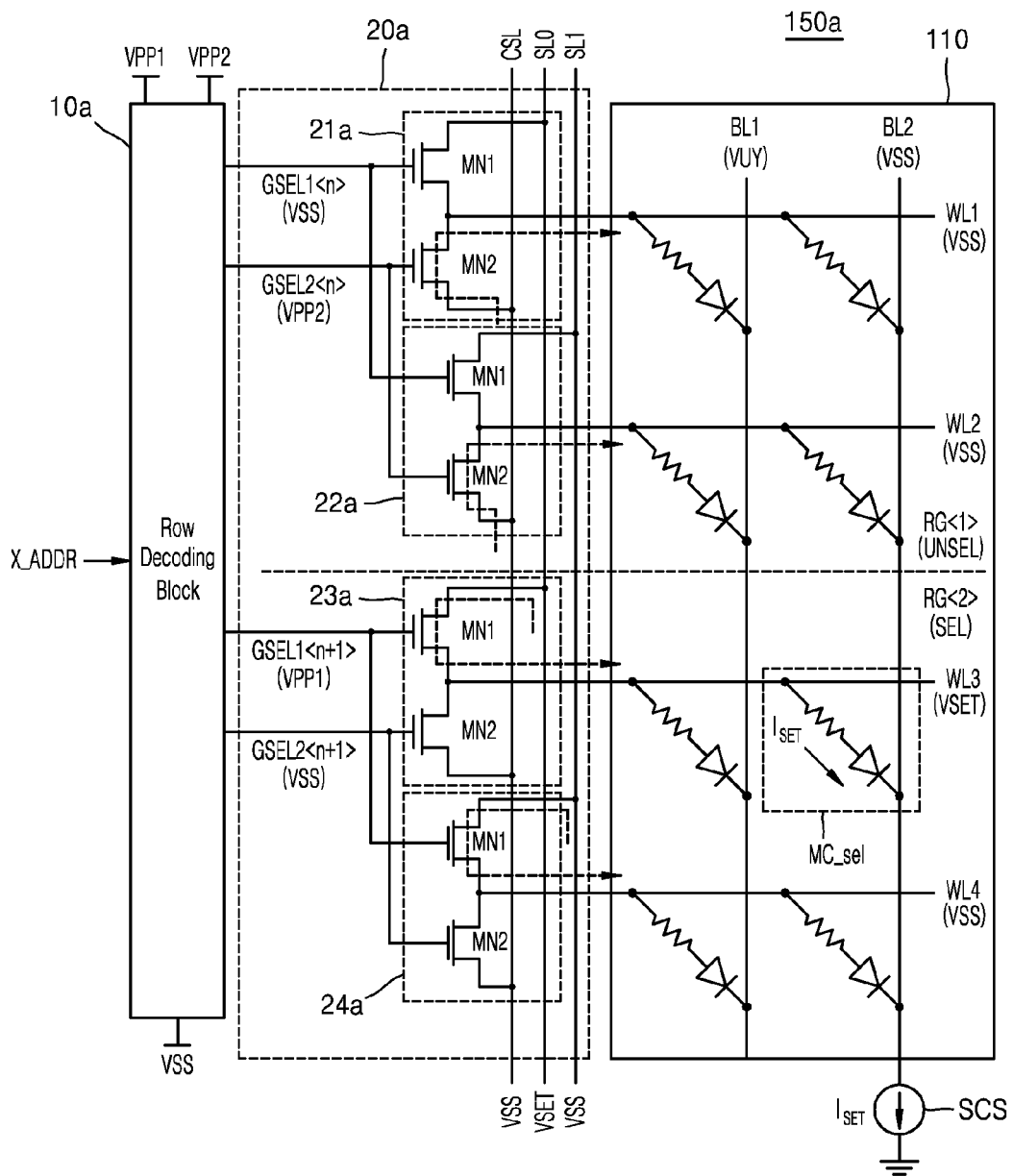

FIGS. 9A and 9B are diagrams for describing operations of a row decoder 150 according to the embodiment of the inventive concept, when a set writing operation is performed on the memory device 100. FIG. 9A shows a case where the set writing operation is performed on at least one memory cell included in the first region RG<1>, and FIG. 9B shows a case in which the set writing operation is performed on at least one memory cell included in the second region RG<2>. In the present embodiment, each of row selection switch units 21a to 24a includes at least two NMOS transistors, that is, a first NMOS transistor and a second NMOS transistor MN1 and MN2. The first NMOS transistors MN1 are connected to individual source lines SL0 and SL1, and the second NMOS transistors MN2 are connected to a common source line SCL. The individual driving voltage, for example, the set write voltage or the ground voltage, corresponding to each of the word lines disposed in the region including the selected memory cell may be applied to the individual source lines SL0 and SL1. Here, the set write voltage or the ground voltage may be provided via a voltage driver (see FIG. 8A).

Referring to FIG. 9A, a set writing operation is performed on a memory cell MC_sel that is one of the memory cells included in the first region RG<1> of the memory cell array 110. Accordingly, the first word line WL1 has to be selected, and thus, the first switching signal GSEL1<n> is activated to the voltage level of the first voltage VPP1, and the second switching signal GSEL2<n> is inactivated to the voltage level of the third voltage, for example, the ground voltage VSS. The first switches SW1 of the first and second row selection switch units 21a and 22a are respectively connected to the first source line SL0 and the second source line SL1. The set write voltage VSET is applied to the first source line SL0, and the ground voltage VSS may be applied to the second source line SL1 as the inhibit voltage. Accordingly, the set write voltage VSET is applied to the first word line WL1, and the ground voltage VSS is applied to the second word line WL2. Also, the first switching signal GSEL1<n+1> may be inactivated to the voltage level of the third voltage, and the second switching signal GSEL2<n+1> may be activated to the voltage level of the second voltage VPP2. The second switches SW2 of the third and fourth row selection switch units 23a and 24a are connected to the common source line CSL, and the ground voltage VSS may be applied to the common source line CSL as the inhibit voltage. Accordingly, the ground voltage VSS may be applied to the third and fourth word lines WL3 and WL4. A set current source SCS for providing a set current Iset is connected to a bit line BL1 to which the selected memory cell MC_sel is connected, so that the set current Iset flows through the selected memory cell MC_sel to perform the set writing operation.

In addition, as shown in FIG. 9A, each of the row selection switch units 21a to 24a includes at least two NMOS transistors MN1 and MN2. In order to normally turn on the first NMOS transistor MN1 and the second NMOS transistor MN2, a voltage having a voltage level that is equal to or greater than a sum of the voltage level applied to each of the first and second NMOS transistors MN1 and MN2 and a threshold voltage Vth of the NMOS transistor has to be applied to gate terminals of each of the first and second NMOS transistors MN1 and MN2. Accordingly, the voltage level of the first voltage VPP1 is equal to or greater than a sum of the voltage level of the set write voltage and the voltage level of the threshold voltage Vth of the NMOS transistor, and the voltage level of the second voltage VPP2 is equal to or greater than a sum of the voltage level of the ground voltage VSS and the voltage level of the threshold voltage Vth of the NMOS transistor. In one embodiment, the voltage level of the second voltage VPP2 may be higher than that of the first voltage VPP1. In addition, the voltage level of the second voltage VPP2 may be lower than the set write voltage VSET.

Referring to FIG. 9B, a set writing operation is performed on one memory cell MC_sel from among the memory cells included in the second region RG<2> of the memory cell array 110. Accordingly, the third word line WL3 has to be selected, and thus, the first switching signal GSEL1<n+1> is activated to the voltage level of the first voltage VPP1 and the second switching signal GSEL2<n+1> is inactivated to the voltage level of the third voltage, for example, the ground voltage VSS. The first switches SW1 of the third and fourth row selection switch units 23a and 24a are respectively connected to the first source line SL0 and the second source line SL1, and the set write voltage VSET may be applied to the first source line SL0 and the ground voltage VSS may be applied to the second source line SL1 as the inhibit voltage. Accordingly, the set write voltage VSET may be applied to the third word line WL3 and the ground voltage VSS may be applied to the fourth word line WL4. Also, the first switching signal GSEL1<n> is deactivated to the ground voltage VSS and the second switching signal GSEL2<n> is activated to the voltage level of the second voltage VPP2. The second switches SW2 of the first and second row selection switches 21a and 22a are connected to the common source line CSL, and the ground voltage VSS may be applied to the common source line CSL as the inhibit voltage. Accordingly, the ground voltage VSS is applied to the first and second word lines WL1 and WL2. The set current source SCS providing the set current $I_{SET}$ is connected to a bit line BL2 to which the selected memory cell MC_sel is connected. When the set current ISET flows through the selected memory cell MC_sel, the set writing operation is performed.

Figure 10:
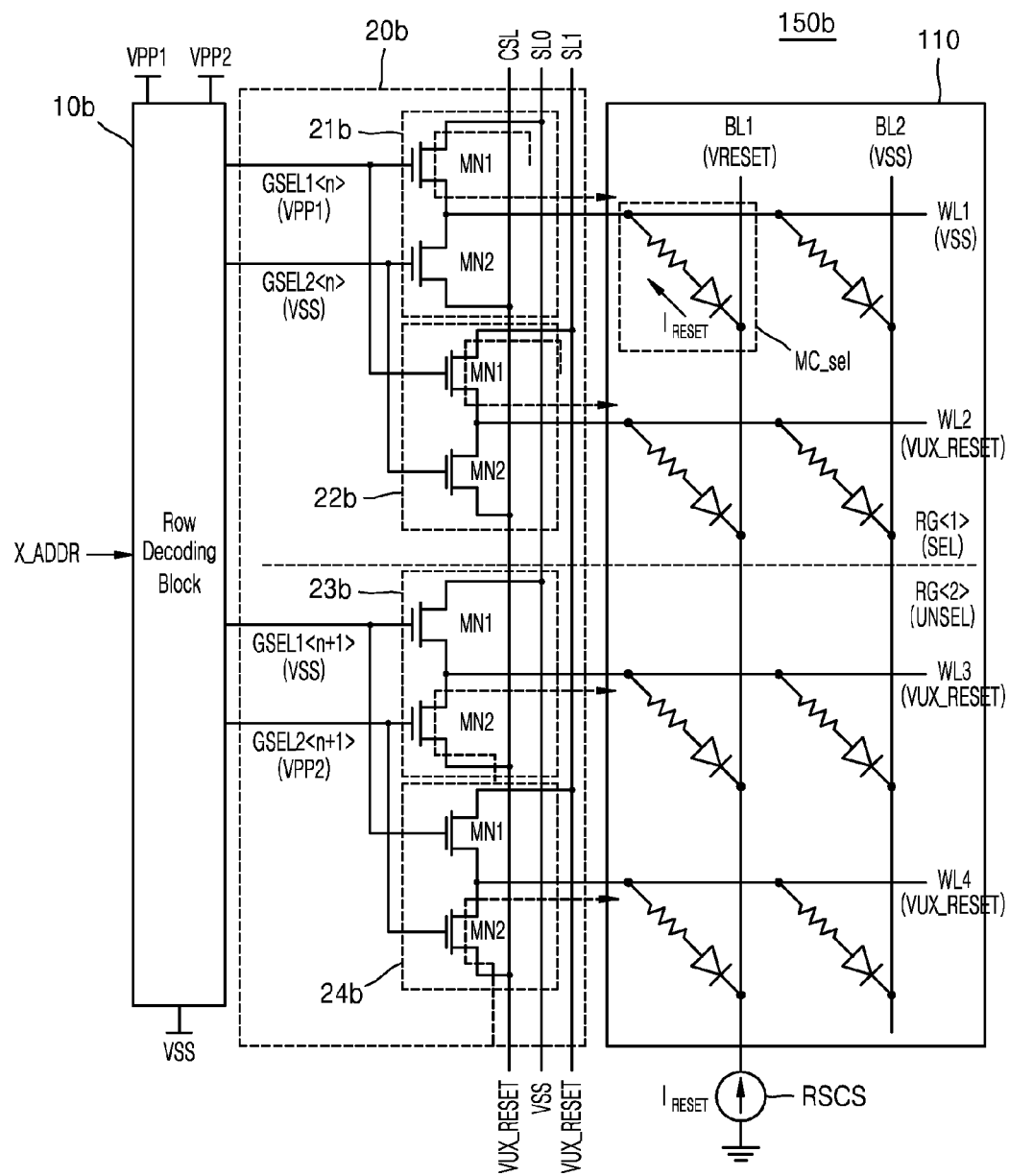
FIG. 10 is a diagram showing operations of the row decoder, when a reset writing operation is performed on a memory device.

FIG. 10 is a diagram for describing operations of the row decoder 150 according to an embodiment of the inventive concept, when a reset writing operation is performed on the memory device 100. FIG. 10 shows a case in which the reset writing operation is performed on at least one memory cell included in the first region RG<1>.

Since the first word line WL1 is to be selected, the first switching signal GSEL1<n> is activated to the voltage level of the first voltage VPP1 and the second switching signal GSEL2<n> is deactivated to the third voltage, for example, the ground voltage VSS. The first switches SW1 of first and second row selection switch units 21b and 22b are respectively connected to the first source line SL0 and the second source line SL1. The ground voltage VSS may be applied to the first source line SL0 and a reset inhibit voltage VUX_RESET may be applied to the second source line SL1 as the inhibit voltage. A voltage level of the reset inhibit voltage VUX_RESET may be greater than that of the ground voltage VSS and may be lower than that of the reset voltage VRESET. The ground voltage VSS may be applied to the first word line WL1 and the reset inhibit voltage VUX_RESET may be applied to the second word line WL2. Also, the first switching signal GSEL1<n+1> may be deactivated to the third voltage and the second switching signal GSEL2<n+1> may be activated to the voltage level of the second voltage VPP2. The second switches SW2 of third and fourth row selection switch units 23b and 24b may be connected to the common source line CSL, and the reset inhibit voltage VUX_RESET may be applied to the common source line CSL as the inhibit voltage. Accordingly, the reset inhibit voltage VUX_RESET may be applied to the third and fourth word lines WL3 and WL4. A reset current source RSCS for providing the reset current $I_{RESET}$ is connected to the bit line BL1 to which the selected memory cell MC_sel is connected. Thus, when the reset current $I_{RESET}$ flows through the selected memory cell MC_sel, the reset writing operation may be performed.

In addition, in order to normally turn on the first and second NMOS transistors MN1 and MN2 included in each of the row selection switch units 21b to 24b, a voltage having a voltage level that is equal to or greater than a sum of the highest voltage level applied to each of the first and second NMOS transistors MN1 and MN2 and the threshold voltage Vth of the NMOS transistor has to be applied to gate terminals of the first and second NMOS transistors MN1 and MN2. Accordingly, the voltage level of the first voltage VPP1 is equal to or greater than a sum of the ground voltage VSS and the voltage level of the threshold voltage Vth of the NMOS transistor, and the voltage level of the second voltage VPP2 is equal to or greater than a sum of the voltage levels of the reset inhibit voltage VUX_RESET and the threshold voltage Vth of the NMOS transistor. In one embodiment, the voltage level of the first voltage VPP1 may be lower than that of the second voltage VPP2, and the voltage level of the first voltage VPP1 may be lower than that of the reset inhibit voltage VUX_RESET.

Figure 11:
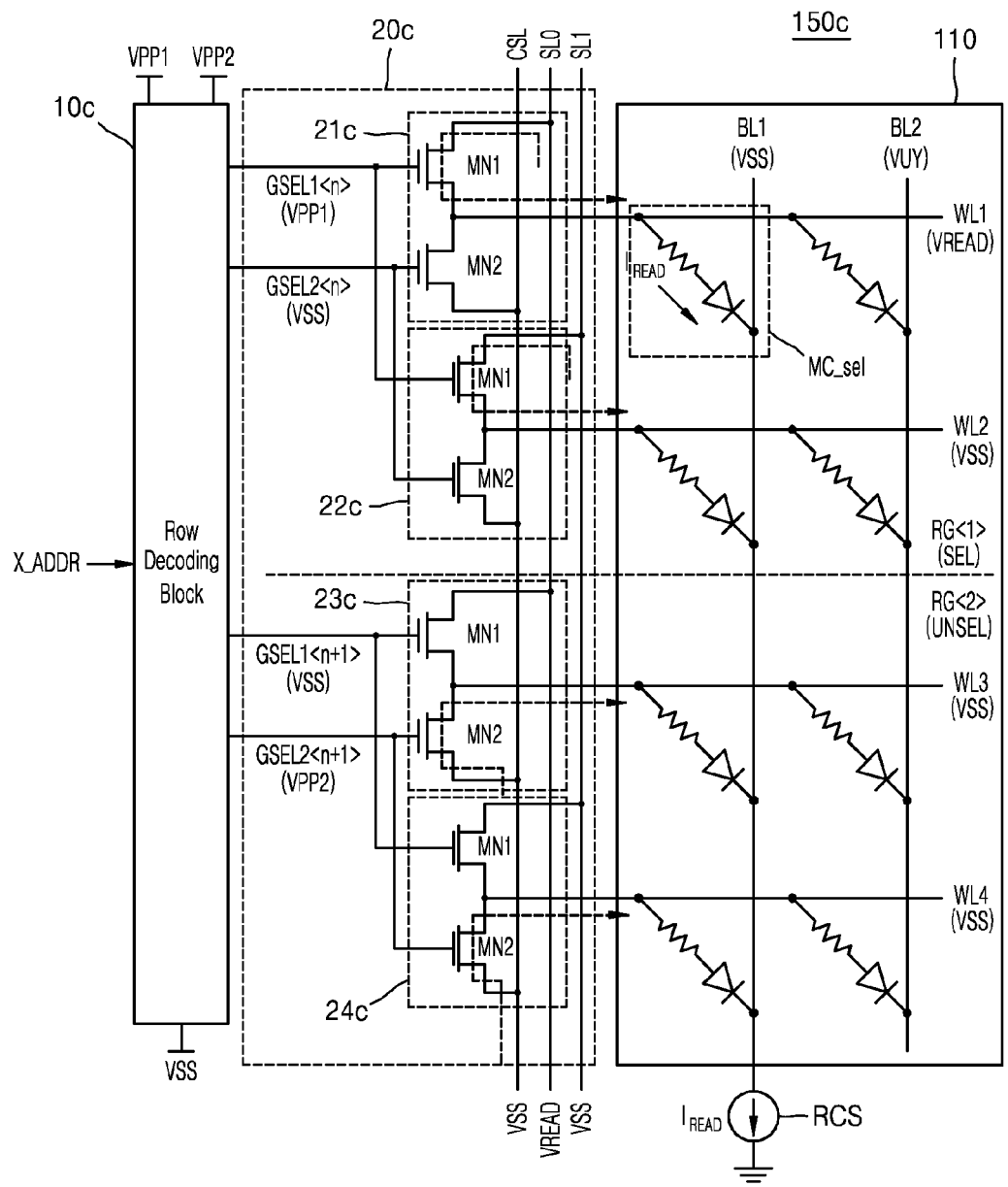
FIG. 11 is a diagram showing operations of the row decoder, when a reading operation is performed on a memory device.

FIG. 11 is a diagram for describing operations of the row decoder 150 according to an embodiment of the inventive concept, in which a reading operation is performed on the memory device 100. FIG. 11 shows a case in which the reading operation is performed on at least one memory cell included in the first region RG<1>.

Referring to FIG. 11, a reading operation is performed on one memory cell MC_sel from among the memory cells included in the first region RG<1> of the memory cell array 110. Since the first word line WL1 is to be selected, the first switching signal GSEL1<n> is activated to the voltage level of the first voltage VPP1 and the second switching signal GSEL2<n> is deactivated to the third voltage, for example, the ground voltage VSS. The first switches SW1 of the first and second row selection switch units 21c and 22c are respectively connected to the first source line SL0 and the second source line SL1, and the read voltage VREAD may be applied to the first source line SL0 and the ground voltage VSS may be applied to the second source line SL1 as the inhibit voltage. In another embodiment, the inhibit voltage may have a voltage level between that of the read voltage VREAD and the ground voltage VSS. The read voltage VREAD is applied to the first word line WL1 and the ground voltage VSS is applied to the second word line WL2. Also, the first switching signal GSEL1<n+1> is deactivated to the third voltage and the second switching signal GSEL2<n+1> is activated to the voltage level of the second voltage VPP2. The second switches SW2 of the third and fourth row selection switch units 23c and 24c are connected to the common source line CSL, and the ground voltage VSS may be applied to the common source line CSL as the inhibit voltage. Accordingly, the ground voltage VSS may be applied to the third and fourth word lines WL3 and WL4. A read current source RCS for providing the read current $I_{READ}$ is connected to the bit line BL1 to which the selected memory cell MC_sel is connected. The read circuit 122 detects the voltage level of the bit line BL1 or the current amount flowing through the bit line BL1 and senses the data based on the detected value, and then, the reading operation is performed.

In addition, as shown in the drawing, each of the row selection switch units 21c to 24c includes at least two NMOS transistors MN1 and MN2, that is, the first and second NMOS transistors MN1 and MN2. In addition, in order to normally turn on the first and second NMOS transistors MN1 and MN2, a voltage having a voltage level that is equal to or greater than a sum of the maximum voltage level applied to each of the first and second NMOS transistors MN1 and MN2 and the threshold voltage Vth of the NMOS transistor is applied to the gate terminals of the first and second NMOS transistors MN1 and MN2. Accordingly, the voltage level of the first voltage VPP1 is equal to or greater than the sum of the voltage level of the read voltage VREAD and the voltage level of the threshold voltage of the NMOS transistor, and the voltage level of the second voltage VPP2 is equal to or greater than the sum of the voltage level of the inhibit voltage, that is, the ground voltage VSS, and the voltage level of the threshold voltage of the NMOS transistor. According to the present embodiment, the voltage level of the first voltage VPP1 may be greater than that of the second voltage VPP2, and the voltage level of the second voltage VPP2 may be lower than that of the read voltage VREAD.

Figure 12:
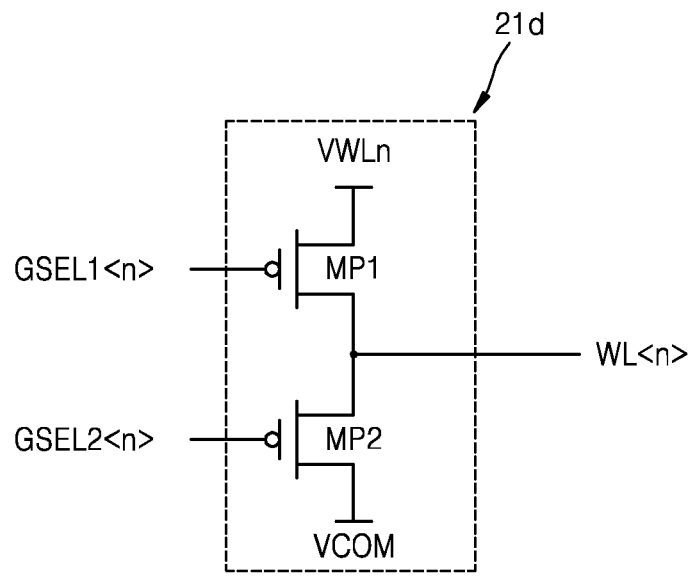
FIGS. 12 and 13 are diagrams showing modified examples of a row selection switch unit according to an exemplary embodiment.
Figure 13:
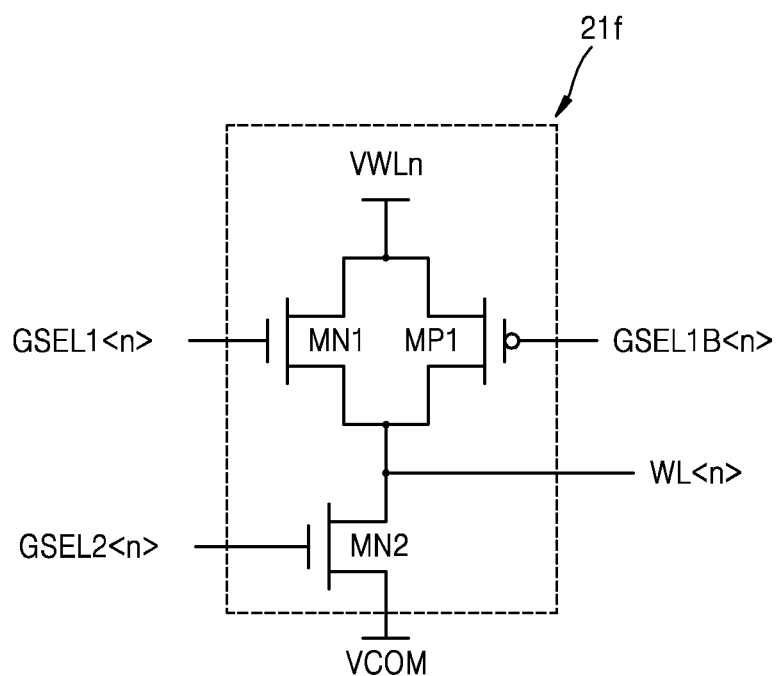

FIGS. 12 and 13 are circuit diagrams showing other examples of the row selection switch unit according to embodiments of the inventive concept.

Referring to FIG. 12, a row selection switch unit 21d includes at least two PMOS transistors, that is, a first PMOS transistor MP1 and a second PMOS transistor MP2. The first PMOS transistor MP1 operates in response to the first switching signal GSEL1<n>, and the second PMOS transistor MP2 operates in response to the second switching signal GSEL2<n>. Voltage levels of the first switching signal GSEL1<n> and the second switching signal GSEL2<n> in activated states may be determined based on voltage levels of voltages VWLn and VCOM applied to the first PMOS transistor MP1 and the second PMOS transistor MP2, and may be different from each other.

Referring to FIG. 13, a row selection switch unit 21f includes at least two NMOS transistors, that is, the first and second NMOS transistors MN1 and MN2, and at least one PMOS transistor MP1. When comparing the row selection switch unit 21f of FIG. 13 with the row selection switch units 21 to 24 of FIG. 9A, the row selection switch unit 21f of FIG. 13 further includes the PMOS transistor MP1. The first NMOS transistor MN1 and the first PMOS transistor MP1 are connected in parallel to operate as transmission gate. The first switching signal GSEL1<n> is applied to the first NMOS transistor MN1 and the third switching signal GSEL1B<n> is applied to the first PMOS transistor MP1. Here, the third switching signal GSEL1B<n> may be a reverse signal of the first switching signal GSEL1<n>, that is, a signal having the same voltage level as that of the first switching signal GSEL1<n> and an opposite phase to that of the first switching signal GSEL1<n>.

Other structures and operations of the row selection switch unit 21f of FIG. 13 are similar to those of the row selection switch units 21 to 24 of FIG. 9A, and thus, detailed descriptions thereof are omitted here.

Figure 14:
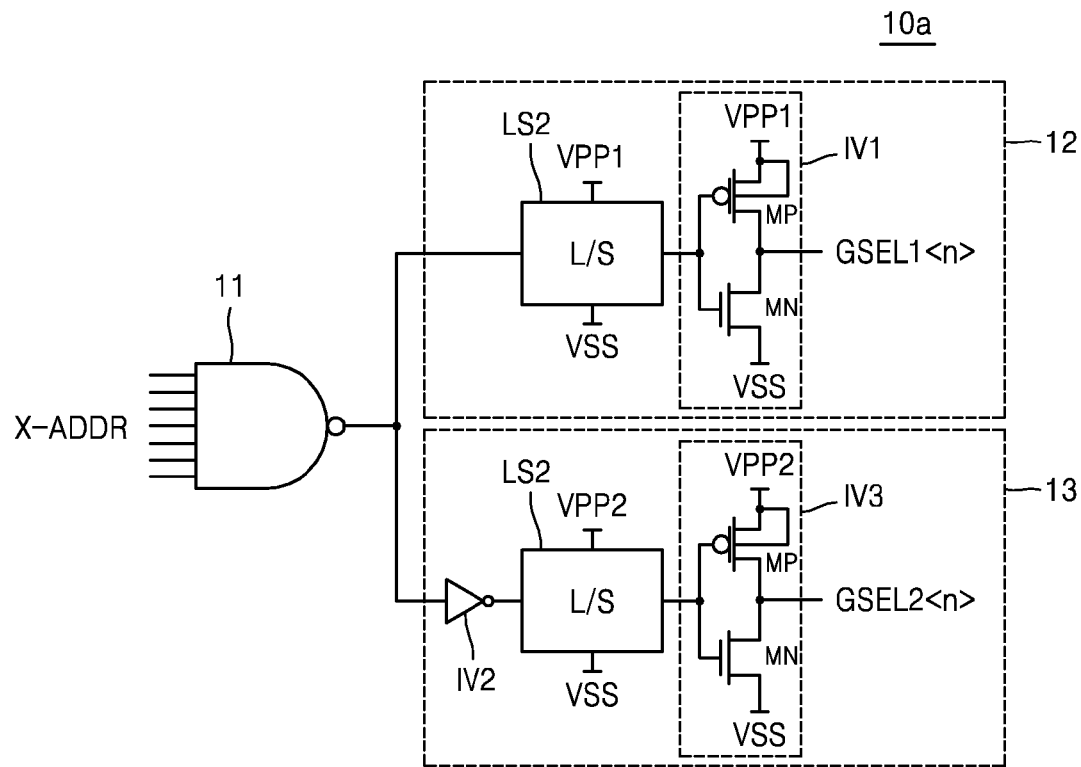
FIG. 14 is a circuit diagram of a row decoding block according to an exemplary embodiment.

FIG. 14 is a circuit diagram of a row decoding block 10, according to an embodiment of the inventive concept.

Referring to FIG. 14, the row decoding block 10 includes a logic gate 11, a first switching signal generation circuit 12, and a second switching signal generation circuit 13.

The logic gate 11 outputs a logic signal, for example, a logic high signal or a logic low signal, based on the row address X_ADDR.

The first switching signal generation circuit 12 operates based on the first voltage VPP1 and the third voltage, for example, the ground voltage VSS, and converts the logic signal output from the logic gate 11 into the first switching signal GSEL1<n>, which is an analog signal. The first switching signal generation circuit 12 includes a first level shifter LS1 and a first inverter IV1. The first level shifter LS1 shifts the voltage level of the logic signal into that of the first voltage VPP1 or the ground voltage VSS. The first inverter IV1 is a CMOS inverter including an NMOS transistor and a PMOS transistor, and generates the first switching signal GSEL1<n> based on an output signal from the first level shifter LS1. The first voltage VPP1 or the ground voltage VSS may be output as the first switching signal GSEL1<n>.

The second switching signal generation circuit 13 operates based on the second voltage VPP2 and the third voltage, for example, the ground voltage VSS, and converts the logic signal output from the logic gate 11 into the second switching signal GSEL2<n> that is an analog signal. The second switching signal generation circuit 13 includes a second level shifter LS2, a second inverter IV2, and a third inverter IV3. The second inverter IV2 may output an inverted logic signal, for example. The second level shifter LS2 shifts the voltage level of the inverted logic signal to that of the second voltage VPP2 or the ground voltage VSS. The third inverter IV1 is a CMOS inverter, and generates the second switching signal GSEL2<n> based on the output signal from the second level shifter LS2. The second voltage VPP2 or the ground voltage VSS may be output as the second switching signal GSEL2<n>.

In FIG. 14, a circuit generating a pair of first and second switching signals GSEL1<n> and GSEL2<n> is shown for convenience of description, although other embodiments of the inventive concept are not limited thereto. The row decoding block 10 (see FIG. 8A) may generate multiple first and second switching signals. The row decoding block 10 may include multiple circuits as shown in FIG. 14, and may generate multiple first and second switching signals.

Figure 15:
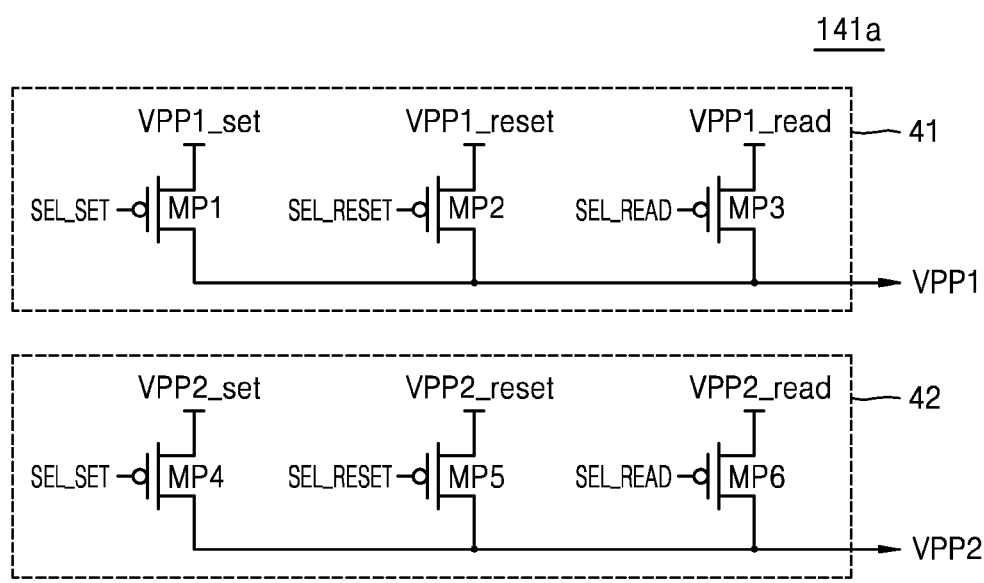
FIG. 15 is a circuit diagram of a voltage selector according to an exemplary embodiment.

FIG. 15 is a circuit diagram showing an example of a voltage selector 141a, according to the embodiment of the inventive concept.

Referring to FIG. 15, the voltage selector 141a may includes a first voltage selection circuit 41 outputting the first voltage VPP1 and a second voltage selection circuit 42 outputting the second voltage VPP2.

The first voltage selection circuit 41 outputs the first voltage VPP1 according to the operating mode of the memory device (100 of FIG. 2) based on mode selection signals SEL_SET, SEL_RESET, and SEL_READ. The first voltage selection circuit 41 may include multiple switches operating in response respectively to the mode selection signals SEL_SET, SEL_RESET, and SEL_READ. According to one embodiment, the switches may include MOS transistors as shown in FIG. 15, for example. In FIG. 15, the switches are depicted as PMOS transistors, but are not limited thereto. For example, the switches may be NMOS transistors or transmission gates.

The switches, such as first to third PMOS transistors MP1 to MP3, for example, in the first voltage selection circuit 41 is configured to output a first set voltage VPP1_set, a first reset voltage VPP1_reset, or a first read voltage VPP1_read as the first voltage VPP1 in response to respective mode selection signals. For example, when the memory device 100 performs the set writing operation, the PMOS transistor MP1 is turned on in response to the set selection signal SEL_SET, and outputs the first set voltage VPP1_set as the first voltage VPP1.

The second voltage selection circuit 42 outputs the second voltage VPP2 according to the operating mode of the memory device 100 based on the mode selection signals SEL_SET, SEL_RESET, and SEL_READ. A structure and operations of the second voltage selection circuit 42 are similar to those of the first voltage selection circuit 41.

Switches, such as fourth to sixth PMOS transistors MP4 to MP6, for example, in the second voltage selection circuit 42 output a second set voltage VPP2_set, a second reset voltage VPP2_reset, or a second read voltage VPP2_read as the second voltage VPP2 in response to the corresponding mode selection signals. For example, when the memory device 100 performs the set writing operation, the fourth PMOS transistor MP4 is turned on in response to the set selection signal SEL_SET, and outputs the second set voltage VPP2_set as the second voltage VPP2.

Accordingly, the voltage levels of the first voltage VPP1 and the second voltage VPP2 may vary depending on the operating mode of the memory device 100.

Figure 16:
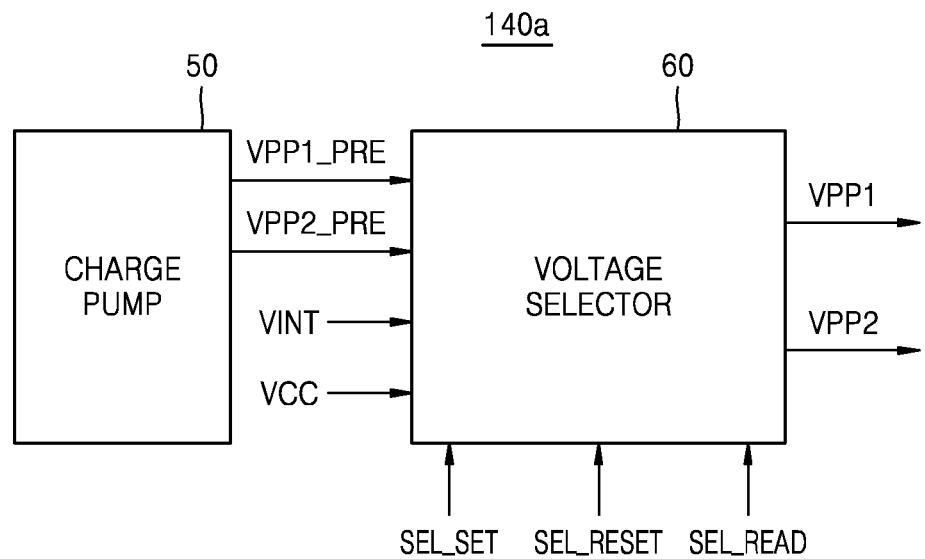
FIG. 16 is a block diagram of a voltage generator according to an exemplary embodiment.

FIG. 16 is a block diagram of a voltage generator 140a, according to an embodiment of the inventive concept. Referring to FIG. 16, the voltage generator 140a includes a charge pump 50 and a voltage selector 60. The charge pump 40 may generate a first high voltage VPP1_PRE and a second high voltage VPP2_PRE based on a power voltage (not shown) applied thereto. Here, a voltage level of the first high voltage VPP1_PRE may be higher than that of the second high voltage VPP2_PRE. In one embodiment of the inventive concept, the power voltage applied to the charge pump 50 may be an analog power voltage VCC.

The voltage selector 60 receives the first high voltage VPP1_PRE, the second high voltage VPP2_PRE, and a logic power voltage VINT. The voltage selector 60 also receives the analog power voltage VCC. A voltage level of the analog power voltage VCC may be higher than that of the logic power voltage VINT and the voltage level of the second high voltage VPP2_PRE may be higher than that of the analog power voltage VCC.

The voltage selector 60 selects and outputs one of the received voltages as the first voltage VPP1 based on the mode selection signals SEL_SET, SEL_RESET, and SEL_READ, and selects and outputs another of the received voltages as the second voltage VPP2. As such, the voltage levels of the first voltage VPP1 and the second voltage VPP2 may vary depending on the operating mode of the memory device.

In the present embodiment, the charge pump 50 is provided to generate the high voltage, but other embodiments of the inventive concept are not limited thereto. The charge pump 50 may be replaced with another circuit for generating the high voltage. For example, another voltage boosting circuit generating a voltage having a voltage level that is higher than that of the power voltage based on the power voltage may be used.

Figure 17A:
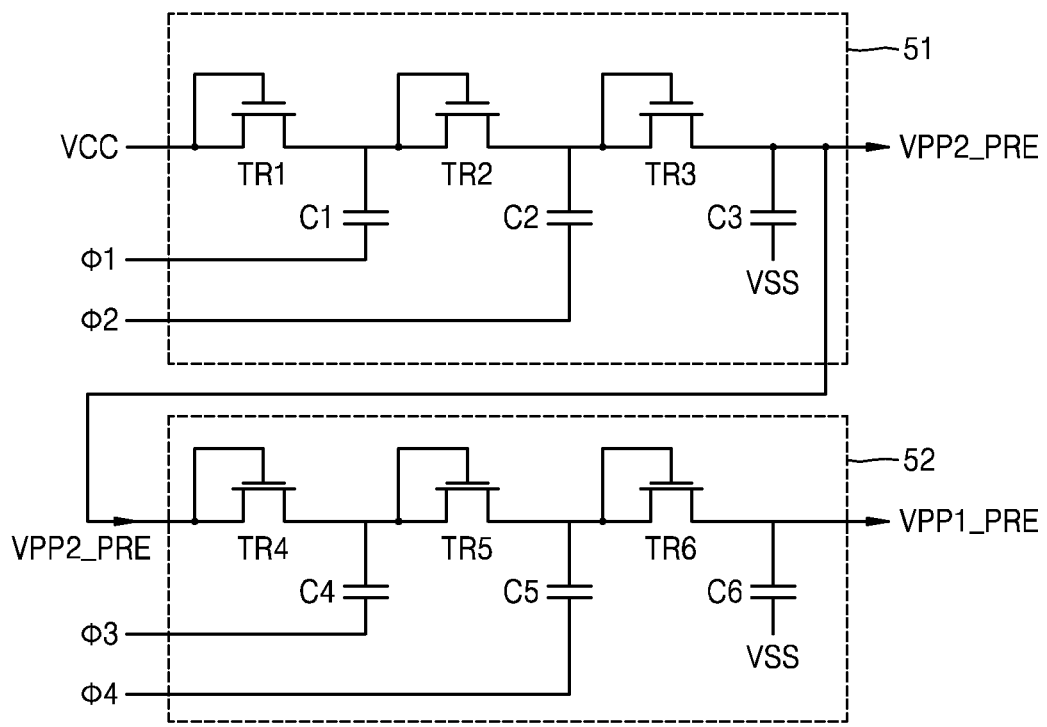
FIG. 17A is a circuit diagram of a charge pump of FIG. 16.
Figure 17B:
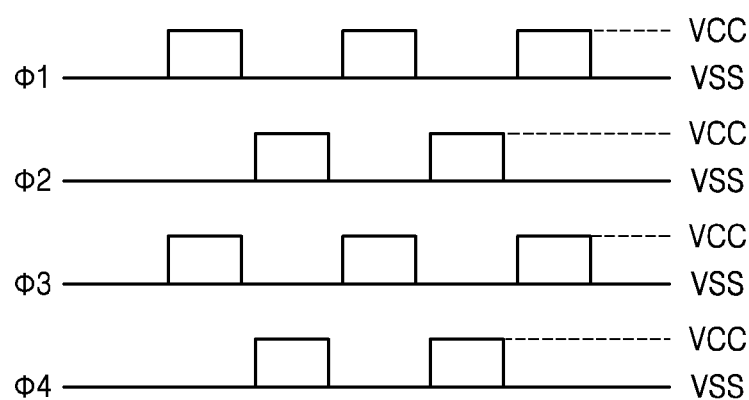
FIG. 17B is a waveform diagram of pumping signals applied to the charge pump of FIG. 17A.

FIG. 17A is a circuit diagram showing an example of the charge pump 50 of FIG. 16, and FIG. 17B is a waveform diagram of pumping signals applied to the charge pump 50, according to an embodiment of the inventive concept.

Referring to FIG. 17A, the charge pump 50 includes a first pumping circuit 51 generating the second high voltage VPP2_PRE based on the analog power voltage VCC, and a second pumping circuit 52 generating the first high voltage VPP1_PRE based on the second high voltage VPP2_PRE. The first pumping circuit 51 may generate the second high voltage VPP2_PRE based on the analog power voltage VCC and pumping signals φ1 and φ2 applied to a first capacitor C1 and a second capacitor C2. The voltage level of the second high voltage VPP2_PRE may vary depending on voltage levels of the first and second pumping signals φ1 and φ2. In addition, as shown in FIG. 17B, when high level voltages of the pumping signals φ1, φ2, φ3 and φ4 are the analog power voltage VCC, the second high voltage VPP2_PRE having a voltage level that is three times greater than that of the analog power voltage, VCC may be generated.

The second pumping circuit 52 may generate the first high voltage VPP1_PRE based on the second high voltage VPP2_PRE and third and fourth pumping signals φ3 and φ4 applied to a fourth capacitor C4 and a fifth capacitor C5. A voltage level of the first high voltage VPP1_PRE may vary depending on the voltage levels of the third and fourth pumping signals φ3 and φ4 and the voltage level of the second high voltage VPP2_PRE. In addition, as shown in FIG. 17B, when the high level voltage of the pumping signals φ1, φ2, φ3, and φ4 is the analog power voltage VCC, the first high voltage VPP1_PRE having a voltage level that is five times greater than that of the analog power voltage, VCC may be generated.

The charge pump 50 included in the voltage generation unit 140a is described above with reference to FIGS. 17A and 17B. However, the charge pump 50 is not limited to the circuit structure shown in FIG. 17A, but may have various circuit structures. Also, the circuit structure of the charge pump 50 may be variously changed according to a target voltage of the first high voltage VPP1_PRE and the second high voltage VPP2_PRE.

Figure 18:
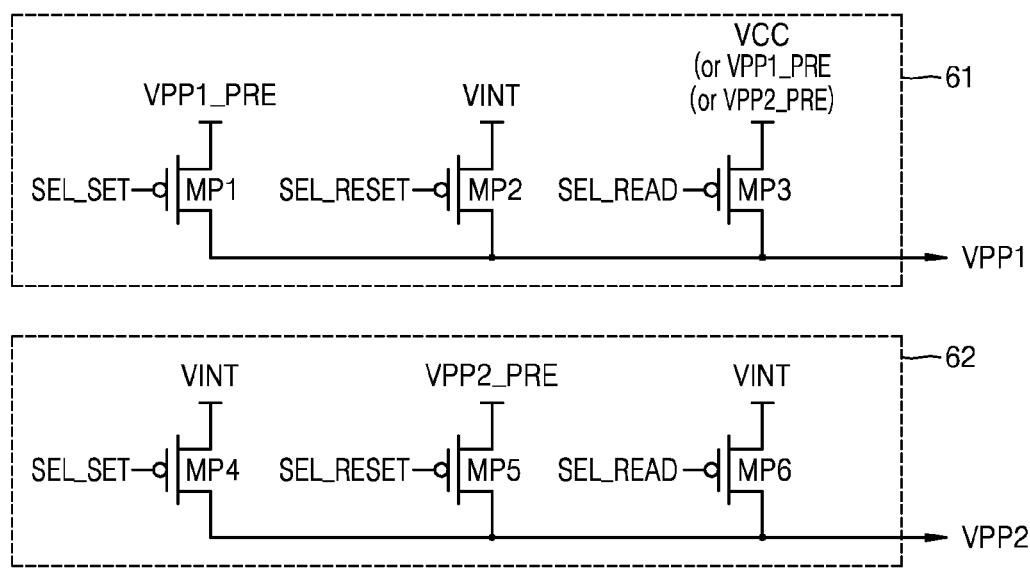
FIG. 18 is a circuit diagram of the voltage selector of FIG. 16.

FIG. 18 is a circuit diagram of an example of the voltage selector 60 of FIG. 16, according to an embodiment of the inventive concept.

Structures and operations of the voltage selector 60 of FIG. 18 are similar to those of the voltage selector 141a of FIG. 15. Referring to FIG. 18, the first high voltage VPP1_PRE generated by the charge pump 50 is applied as the first set voltage VPP1_set, and the logic power voltage VINT is applied as the first reset voltage VPP_reset, the second set voltage VPP2_set, or the second read voltage VPP2_read. Also, one of the analog power voltage VCC, the first high voltage VPP1_PRE, and the second high voltage VPP2_PRE may be applied as the first read voltage VPP1_read. Also, the second high voltage VPP2_PRE may be applied as the second reset voltage VPP2_reset.

A first voltage selection circuit 61 and a second voltage selection circuit 62 may selected for outputting the first voltage VPP1 and the second voltage VPP2, respectively, according to the operating mode of the memory device (100 of FIG. 2), based on the mode selection signals SEL_SET, SEL_RESET, and SEL_READ.

Figure 19:
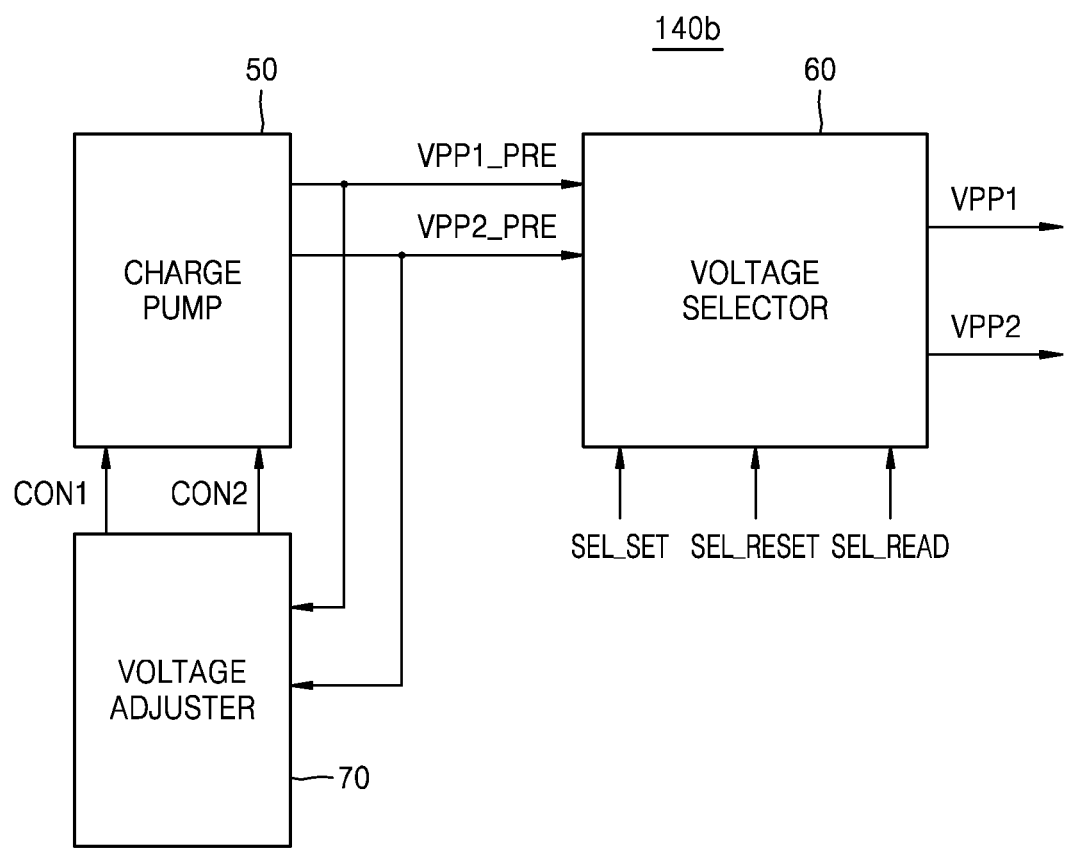
FIG. 19 is a block diagram showing a modified example of the voltage generator according to the exemplary embodiment.

FIG. 19 is a block diagram of another example of the voltage generation unit 140b, according to the embodiment of the inventive concept. Referring to FIG. 19, the voltage generation unit 140b includes the charge pump 50, the voltage selector 60, and a voltage adjuster 70. Structures and operations of the charge pump 50 and the voltage selector 60 are similar to those of the charge pump 50 and the voltage selector 60 described with reference to FIGS. 16 to 18, and thus, detailed descriptions thereof are omitted here.

The voltage adjuster 70 adjusts the voltage levels of the first high voltage VPP1_PRE and the second high voltage VPP2_PRE. The voltage adjuster 70 determines whether the first high voltage VPP1_PRE and the second high voltage VPP2_PRE output from the charge pump 50 have the target voltage levels, and outputs first and second control signals CON1 and CON2 for controlling operations of the charge pump 50 based on the determination result. For example, when the voltage level of the first high voltage VPP1_PRE is higher than the target voltage level, the first control signal CON1 for blocking operations of the second pumping circuit (52 of FIG. 17A) of the charge pump 50 may be output. Otherwise, when the voltage level of the second high voltage VPP2_PRE is higher than the target voltage level, the second control signal CON2 for blocking the operations of the first pumping circuit (51 of FIG. 17A) may be output. As such, the voltage levels of the first high voltage VPP1_PRE and the second high voltage VPP2_PRE may be adjusted.

Figure 20:
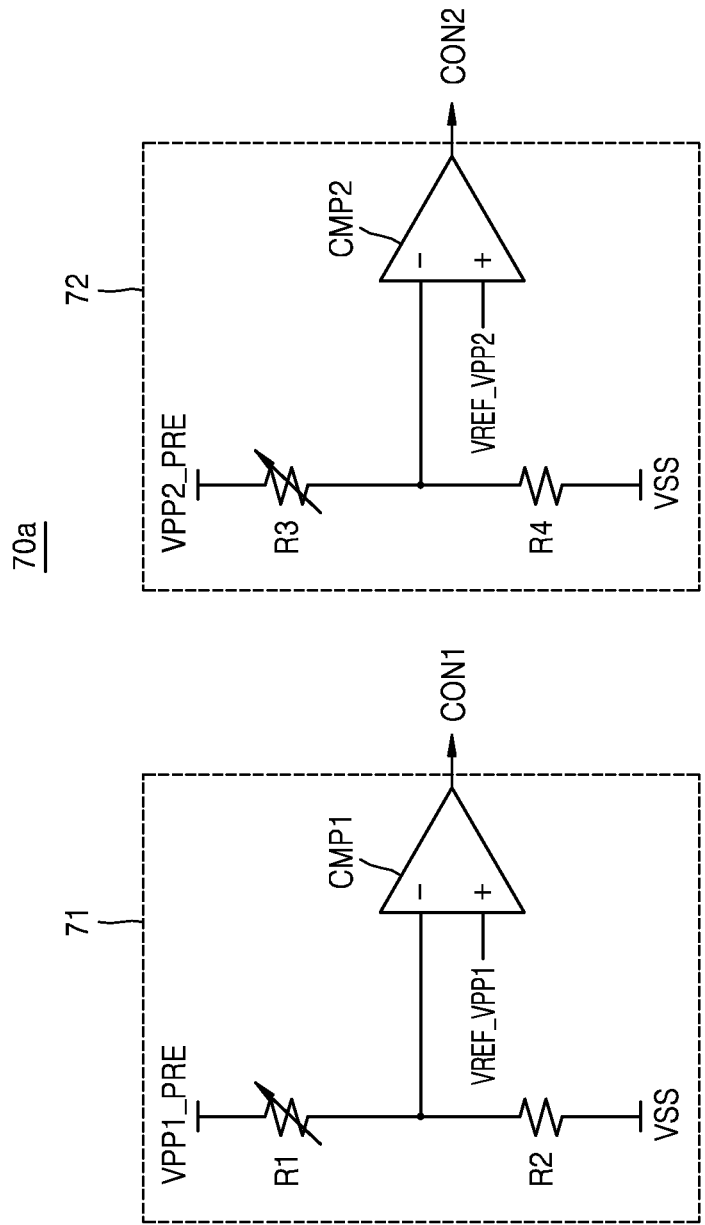
FIG. 20 is a circuit diagram of a voltage adjuster of FIG. 19.

FIG. 20 is a circuit diagram showing an example of the voltage adjuster 70 of FIG. 19, according to an embodiment of the inventive concept.

Referring to FIG. 20, the voltage adjuster 70 includes a first adjustment circuit 71 and a second adjustment circuit 72. The first adjustment circuit 71 senses the voltage level of the first high voltage VPP1_PRE to generate the first control signal CON1, and the second adjustment circuit 72 senses the voltage level of the second high voltage VPP2_PRE to generate the second control signal CON2.

The first adjustment circuit 71 distributes the first high voltage VPP1_PRE using a first resistor R1 and a second resistor R2, and compares the distributed voltages with a first reference voltage VREF_VPP1 (e.g., target value) to generate the first control signal CON1. For example, when the first high voltage VPP1_PRE is higher than the target voltage, a first comparator CMP1 generates the first control signal CON1 having a low level, and when the first high voltage VPP1_PRE is lower than the target voltage, the first comparator CMP1 generates the first control signal CON1 having a high level.

In an embodiment of the inventive concept, the first resistor R1 may be a variable resistor, where the resistance value of the first resistor R1 may vary depending on the operating mode of the memory device (100 of FIG. 1). For example, the resistance value of the first resistor R1 may be set as a predetermined value whether the memory device 100 performs the set writing operation, the reset writing operation, or the reading operation. Accordingly, the voltage level of the first high voltage VPP1_PRE may vary depending on the operating mode of the memory device 100.

In another embodiment of the inventive concept, a voltage level of the first reference voltage VREF_VPP1 may vary depending on the operating mode of the memory device 100. Accordingly, the voltage level of the first high voltage VPP1_PRE may vary depending on the operating mode of the memory device 100.

The second adjustment circuit 72 distributes the second high voltage VPP2_PRE using a third resistor R3 and a fourth resistor R4, and compares the distributed voltage with a second reference voltage VREF_VPP2 to generate the second control signal CON2. Structures and operations of the second adjustment circuit 72 are similar to those of the first adjustment circuit 71, and thus detailed descriptions thereof are omitted here.

In an embodiment of the inventive concept, the third resistor R3 may be a variable resistor, where the resistance value of the third resistor R3 may vary depending on the operating mode of the memory device 100. For example, the resistance value of the third resistor R3 may be set as a predetermined value whether the memory device 100 performs the set writing operation, the reset writing operation, or the reading operation. Accordingly, the voltage level of the second high voltage VPP2_PRE may vary depending on the operating mode of the memory device 100.

In another embodiment of the inventive concept, a voltage level of the second reference voltage VREF_VPP2 may vary depending on the operating mode of the memory device 100. Accordingly, the voltage level of the second high voltage VPP2_PRE may vary depending on the operating mode of the memory device 100.

Figure 21:
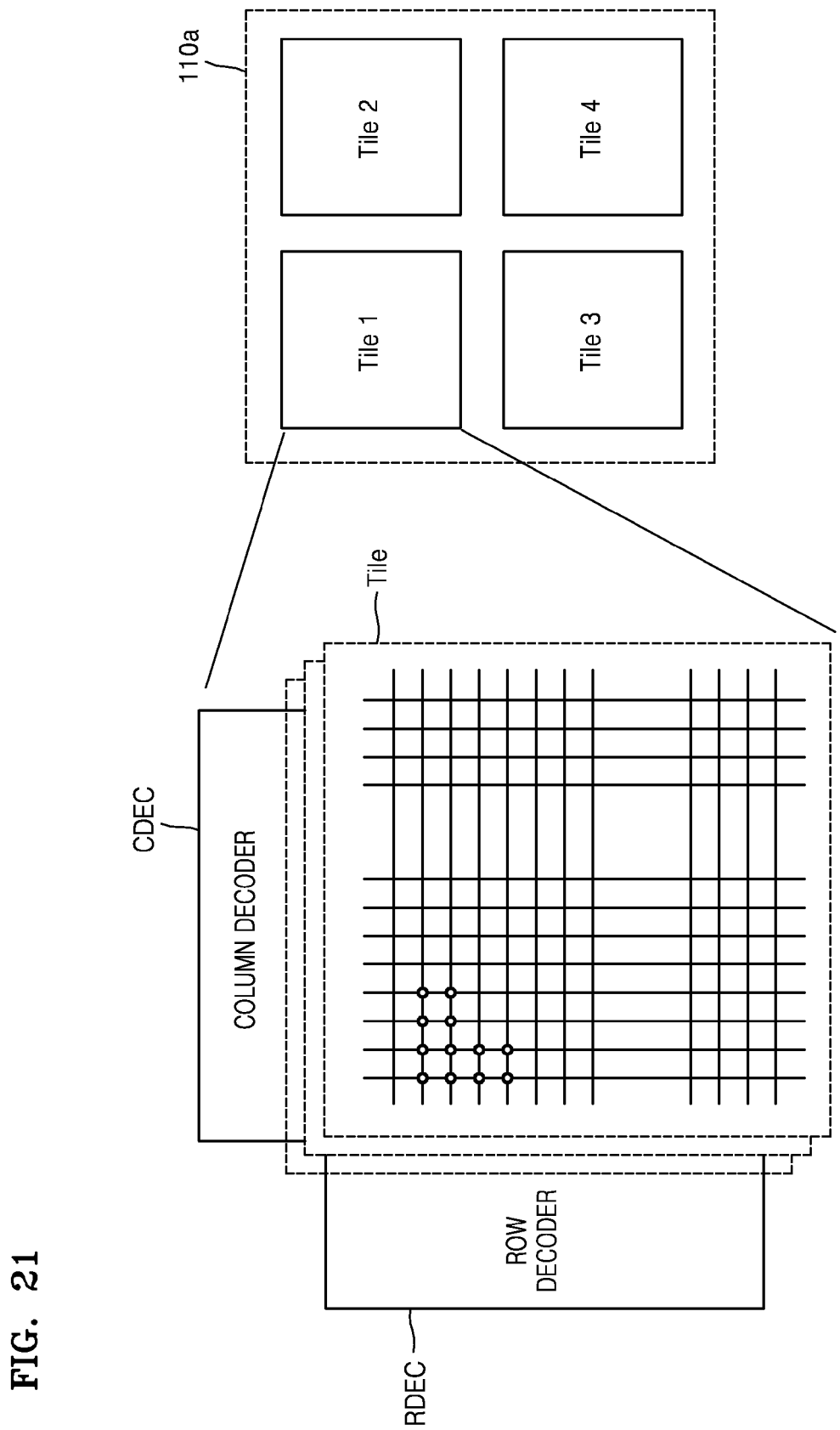
FIG. 21 is a diagram showing a configuration of a tile and arrangement of a row decoder and a column decoder, according to an exemplary embodiment.

FIG. 21 is a diagram showing a structure of a tile and arrangement of the row decoder RDEC and the column decoder CDEC, according to an embodiment of the inventive concept.

A memory cell array 110a may include multiple tiles Tile 1 to Tile 4. A tile is a unit for classifying cell regions of the memory cell array 110a, and each of the cell regions includes multiple memory cells that are connected to word lines and bit lines. In addition, the word lines may be connected to one row decoder RDEC (or row selection block) and the bit lines may be connected to one column decoder CDEC (or column selection block), and the above cell region may be defined as a tile. The set writing operation, the reset writing operation, and the reading operation on the memory cell may be performed in tile units. For example, the set writing operation may be performed on a first tile Tile 1, and at the same time, the reset writing operation may be performed on a second tile Tile 2.

Each of the tiles Tile 1 to Tile 4 may include the memory cells that are two-dimensionally arranged in a horizontal direction. In another embodiment, each of the tiles Tile 1 to Tile 4 may include the memory cells that are arranged three-dimensionally in a vertical direction. The row decoder RDEC or the column decoder CDEC connected to each of the tiles may include at least a part of the row decoder 150, 150a, 150b, or 150c according to the embodiments of the inventive concept shown in FIGS. 8A to 14.

FIG. 22 is a flowchart of a method of operating a memory device, according to an embodiment of the inventive concept.

Referring to FIG. 22, the method of operating the memory device according to the present embodiment includes applying a bias voltage to the memory cells included in the memory cell array for performing the writing operation or the reading operation. The descriptions provided above with reference to FIGS. 1 through 21 may be applied to the method of operating the memory device according to the present exemplary embodiment.

According to the method of operating the memory device, the operating mode of the memory device is determined (S110). For example, it may be determined whether the set writing operation, the reset writing operation, or the reading operation is to be performed on the memory cell array based on a command CMD transmitted from the memory controller (e.g., memory controller 200 of FIG. 1).

The first voltage and the second voltage are generated based on the determined operating mode (S120). Here, the first voltage and the second voltage may be voltages of two switching signals in activated states, where the two switching signals are applied to switches SW1 and SW2 included in the decoding selection block, for example, of a row decoding selection block (row switch block 20 of FIG. 8A). The voltage levels of the first voltage and the second voltage may be different from each other. The voltage level of the first voltage may be higher or lower than that of the voltage level of the second voltage according to the operating mode of the memory device. Also, according to the operating mode of the memory device, at least one of the voltage level of the first voltage and the voltage level of the second voltage may be variable.

The first voltage is applied to the switch units connected to a plurality of first signal lines including a selected first signal line (S130). In an embodiment, the first signal lines may be word lines connected to the memory cells. Each of the switch units may include the first switch and the second switch, and the first voltage may be applied to the first switch. In an embodiment, the first switch and the second switch may be MOS transistors of the same conductive type. The first voltage may be applied to the first switch, that is, a gate terminal of a first MOS transistor, so as to turn on the first MOS transistor. The first MOS transistor connected to the selected first signal line may apply a selection voltage, for example, the set write voltage, read voltage, or the ground voltage, to the selected first signal line. The first MOS transistors connected to unselected first signal lines may apply an inhibit voltage to the unselected first signal lines.

The second voltage is applied to a plurality of switch units connected to another plurality of first signal lines (S140). The second voltage is applied to the second switch, that is, the gate terminal of a second MOS transistor, so as to turn on the second MOS transistor. The other plurality of first signal lines are unselected first signal lines. The second MOS transistor may apply the inhibit voltage to the unselected first signal lines.

The writing operation or the reading operation is performed on the memory cell connected to the selected first signal line (S150).

FIG. 23 is a flowchart of a method of operating a memory device, according to another embodiment of the inventive concept.

The method of operating the memory device according to the present embodiment is includes applying a bias voltage to selected memory cells included in the memory cell array for performing the writing operation or the reading operation. The descriptions provided above with reference to FIGS. 1 through 21 may be applied to the method of operating the memory device according to the present exemplary embodiment.

Referring to FIG. 23, the first voltage is applied to one of at least two first conductive type transistors that are connected to the first signal line (S210). The first voltage is a voltage for turning on the first conductive type transistors, and when the first conductive type transistor to which the first voltage is applied is turned on, a selection voltage may be applied to the first signal line. Accordingly, the selection voltage is applied to at least one first signal line from among the plurality of first signal lines arranged in the memory cell array, that is, the above first signal line, the first signal line may be selected, and then, the writing operation or the reading operation may be performed on at least one memory cell connected to the first signal line. The at least two first conductive type transistor switches may include NMOS transistors.

The second voltage is applied to the other of the at least two first conductive type transistor switches connected to the first signal line (S220). The second voltage is a voltage for turning on the other first conductive type transistor, and the inhibit voltage may be applied to the first signal line. The writing operation or the reading operation is not performed on the memory cells connected to the above first signal line, and the inhibit voltage is applied to the memory cells so as to prevent generation of excessive leakage current. Here, the voltage levels of the first and second voltages are different from each other, and the voltage level of the first voltage is determined based on the voltage level of the selection voltage and the voltage level of the second voltage may be determined based on the voltage level of the inhibit voltage.

In one embodiment, the voltage level of at least one of the first voltage and the second voltage may vary depending on the operating mode of the memory device.

In one embodiment, when the memory device performs the set writing operation or the reading operation, the voltage level of the first voltage may be higher than that of the second voltage.

In another embodiment, when the memory device performs the reset writing operation, the voltage level of the second voltage may be higher than that of the first voltage.

Figure 24:
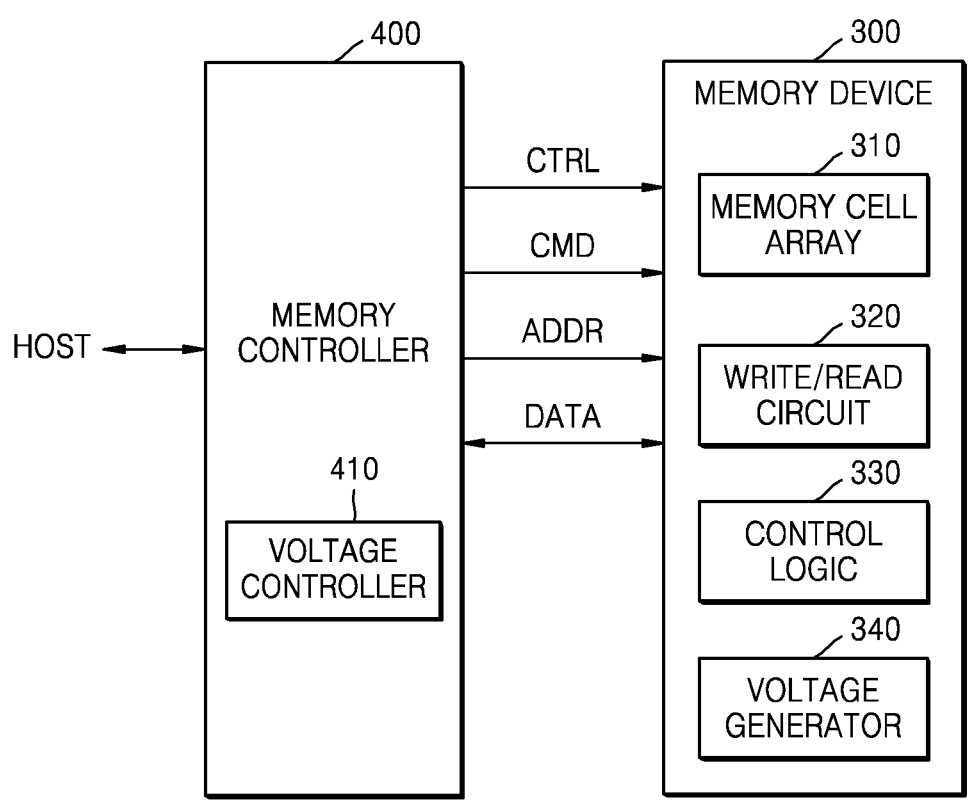
FIG. 24 is a schematic block diagram of a memory system including a resistive memory device according to an exemplary embodiment of the inventive concept.

FIG. 24 is a block diagram of a memory system 2 including the resistive memory device, according to another exemplary embodiment of the inventive concept.

Referring to FIG. 24, the memory system 2 includes a memory device 300 and a memory controller 400. The memory device 300 includes a memory cell array 310, a write/read circuit 320, control logic 330, and a voltage generator 340. The memory controller 400 includes a voltage controller 410.

The voltage controller 410 determines voltage levels of the voltages that are necessary for performing operations of the memory device 300, for example, the set writing operation, the reset writing operation, or the reading operation, and timings of generating the voltages, and may provide signals for controlling the voltage generator 340 to the memory device 300 as a control signal CTRL based on the above determination. For example, the voltage controller 410 may determine voltages levels of switching signals for controlling the switches included in the memory device 300, based on the operating mode of the memory device 300 and voltage levels of driving voltages (or bias voltages) applied to the memory cell array 310 according to the operating mode of the memory device 300, and may control the voltage generator 340 to generate the voltages used to generate the switching signals.

Figure 25:
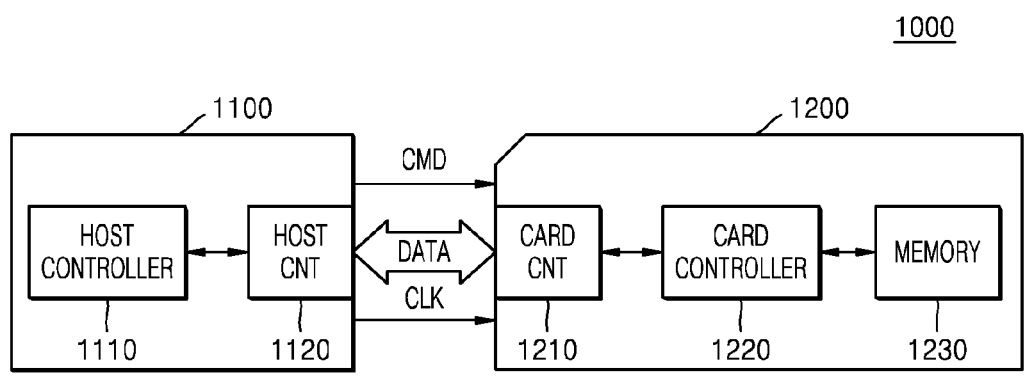
FIG. 25 is a block diagram of a memory card system to which a memory system according to an exemplary embodiment of the inventive concept is applied.

FIG. 25 is a block diagram of a memory card system 1000 having a memory system applied thereto, according to an exemplary embodiment of the inventive concept.

Referring to FIG. 25, the memory card system 1000 includes a host 1100 and a memory card 1200. The host 1100 include a host controller 1110 and a host connector 1120. The memory card 1200 includes a card connector 1210, a card controller 1220, and a memory device 1230. Here, the memory card 1200 may be embodied according to the various exemplary embodiments shown in FIGS. 1 through 24.

The host 1100 may write data to the memory 1200 or may read data stored in the memory 1200. The host controller 1110 may transmit a command CMD, a clock signal CLK generated by a clock generator (not shown) in the host 1100, and data DATA to the memory card 1200 via the host connector 1120.

In response to the command CMD received via the card connector 1210, the card controller 1220 may store the data DATA in the memory device 1230, in synchronization with a clock signal that is generated by a clock generator (not shown) in the card controller 1220. The memory device 1230 may store the data DATA that is transmitted from the host 1100.

The memory card 1200 may be embodied as a compact flash card (CFC), a microdrive, a smart media card (SMC), a multimedia card (MMC), a Security Digital Card (SDC), a memory stick, or a USB flash memory drive.

Figure 26:
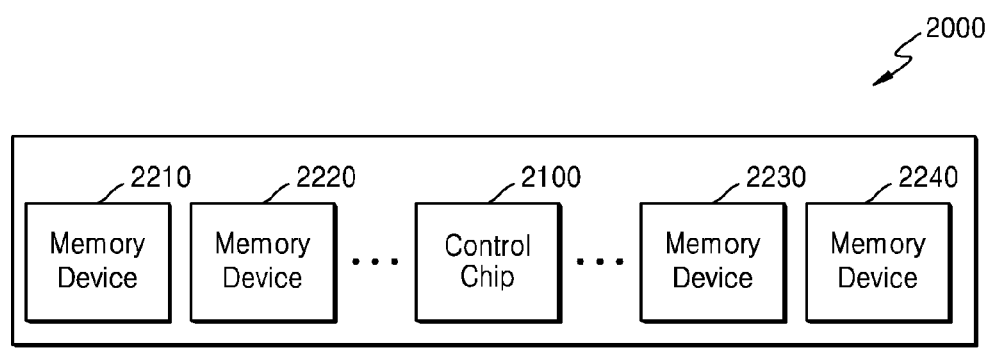
FIG. 26 is a diagram of a resistive memory module according to an exemplary embodiment of the inventive concept.

FIG. 26 illustrates a resistive memory module 2000, according to an exemplary embodiment of the inventive concept. Referring to FIG. 26, the resistive memory module 2000 includes memory devices 2210 through 2240, and a control chip 2100. Each of the memory devices 2210 through 2240 may be embodied according to the various exemplary embodiments shown in FIGS. 1 through 23.

In response to various signals transmitted by an external memory controller, the control chip 2100 may control the memory devices 2210 through 2240. For example, according to various commands and addresses that are transmitted from an external source, the control chip 2100 may activate the memory devices 2210 through 2240 corresponding to the various commands and addresses, and thus may control write and read operations. Also, the control chip 2100 may perform various post processing operations on read data output from each of the memory devices 2210 through 2240, e.g., the control chip 2100 may perform error detection and correction operations on the read data. Also, the control chip 2100 may control the memory devices 2210 to 2240 so as to adjust the number of inhibit voltages generated by each of the memory devices 2210 to 2240 or voltage differences between the inhibit voltages.

Figure 27:
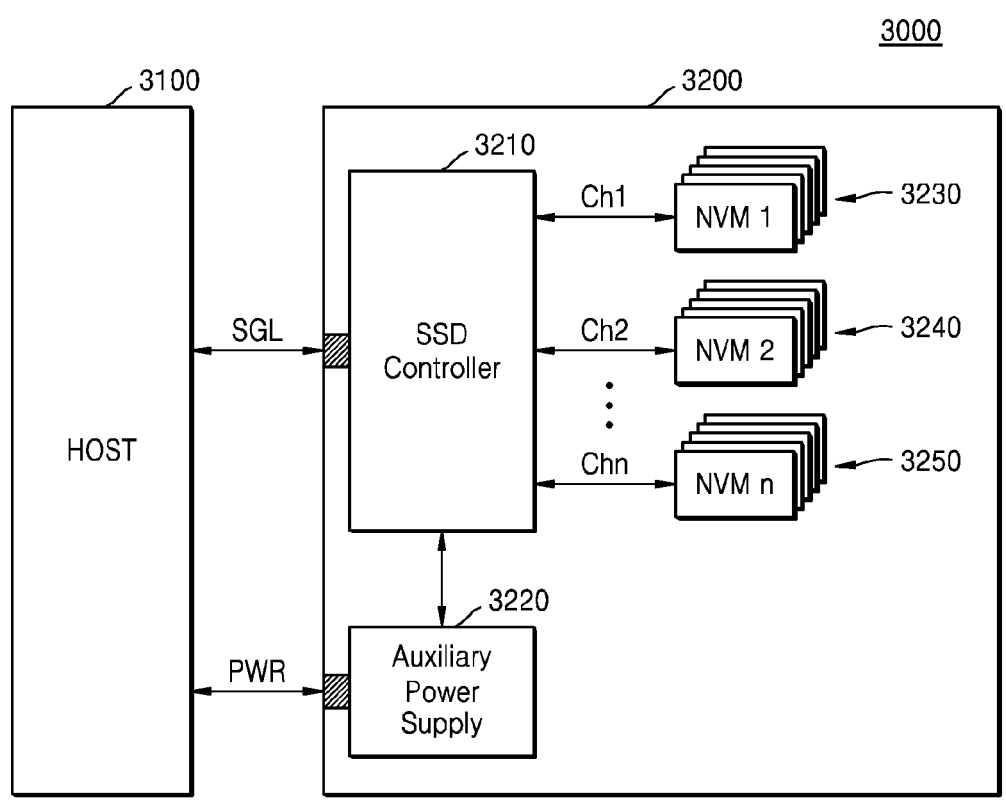
FIG. 27 is a block diagram of a solid state disk (SSD) system to which a memory system according to an exemplary embodiment of the inventive concept is applied.

FIG. 27 is a block diagram of a solid state disk (SSD) system 3000 including a memory system applied thereto, according to an exemplary embodiment of the inventive concept.

Referring to FIG. 27, the SSD system 3000 includes a host 3100 and an SSD 3200. The SSD 3200 exchanges signals with the host 3100 via a signal connector, and may receive a power input from a power connector. The SSD 3200 includes an SSD controller 3210, an auxiliary power device 3220, and a plurality of non volatile memory devices 3230, 3240, and 3250. Here, the SSD 3200 may be embodied according to the various exemplary embodiments of FIGS. 1 through 22.

Figure 28:
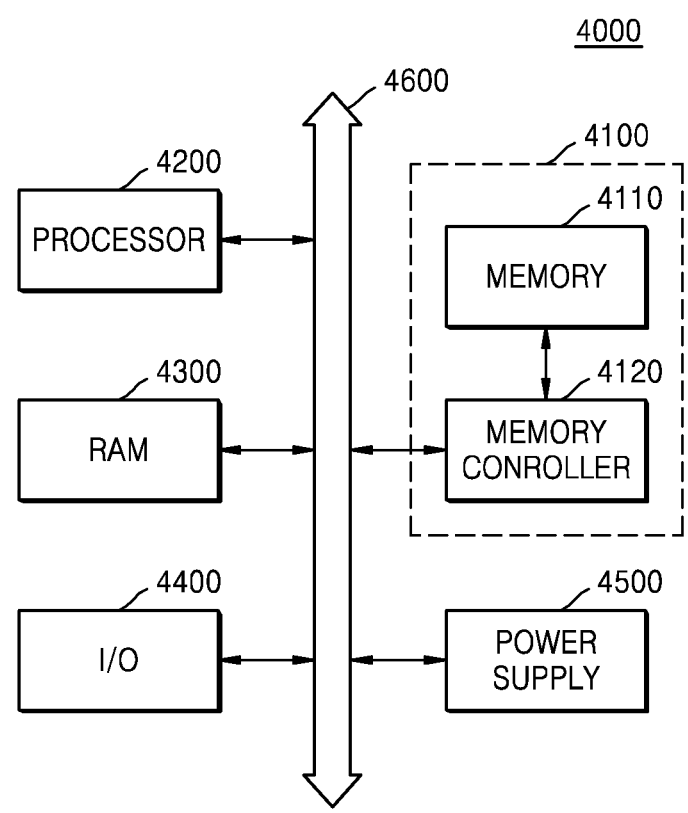
FIG. 28 is a block diagram of a computing system including a memory system according to an exemplary embodiment of the inventive concept.

FIG. 28 is a block diagram of a computing system 4000 including a memory system, according to an exemplary embodiment of the inventive concept.

Referring to FIG. 28, the computing system 4000 includes a memory system 4100, a processor 4200, a RAM 4300, an input/output (I/O) device 4400, and a power supply device 4500. Although not illustrated in FIG. 28, the computing system 4000 may further include ports capable of communicating with a video card, a sound card, a memory card, or a USB device, or other electronic devices. The computing system 4000 may be embodied as a PC, or a portable electronic device such as a notebook computer, a mobile phone, a personal digital assistant (PDA), or a camera.

The processor 4200 may perform particular calculations or tasks. In one or more exemplary embodiments, the processor 4200 may be a micro-processor or a Central Processing Unit (CPU). The processor 4200 may perform communication with the RAM 4300, the I/O device 4400, and the memory system 4100 via a bus 4600 such as an address bus, a control bus, or a data bus. Here, the memory system 4100 may be embodied according to the exemplary embodiments shown in FIGS. 1 through 22.

In one or more exemplary embodiments, the processor 4200 may also be connected to an extended bus such as a Peripheral Component Interconnect (PCI) bus.

The RAM 4300 may store data for operations of the computing system 4000. As described above, the memory device according to the one or more exemplary embodiments of the inventive concept may be applied to the RAM 4300. Alternatively, a DRAM, a mobile DRAM, an SRAM, a PRAM, an FRAM, or an MRAM may be used as the RAM 4300.

The I/O device 4400 may include an input unit such as a keyboard, a keypad, or a mouse, and an output unit such as a printer or a display. The power supply device 4500 may supply an operating voltage for the operations of the computing system 4000.

While the inventive concept has been particularly shown and described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A memory device comprising:
a memory cell array comprising a plurality of memory cells arranged respectively in regions where a plurality of first signal lines cross a plurality of second signal lines; and
a decoder comprising a plurality of line selection switch units connected respectively to the plurality of first signal lines;
wherein each of the plurality of line selection switch units applies a bias voltage to a first signal line corresponding to each of the plurality of line selection switch units in response selectively to a first switching signal and a second switching signal, and
wherein a first switch operating in response to the first switching signal and a second switch operating in response to the second switching signal, the first switch and the second switch are first conductive type transistors, and
wherein the first switch is turned on in response to a first voltage of the first switching signal and the second switch is turned on in response to a second voltage of the first switching signal, voltage levels of the first voltage and the second voltage being different from each other.

2. The memory device of claim 1, wherein the first switch is connected to an individual source line providing a bias voltage to the first signal line, and the second switch is connected to a common source line providing an inhibit voltage commonly to the plurality of first signal lines.

3. The memory device of claim 1, wherein the first switching signal is transited between the first voltage and a third voltage, and the second switching signal is transited between the second voltage and the third voltage.

4. The memory device of claim 3, wherein when the memory device performs a set writing operation or a reading operation, the voltage level of the first voltage is higher than the voltage level of the second voltage, and when the memory device performs a reset writing operation, the voltage level of the first voltage is lower than the voltage level of the second voltage.

5. The memory device of claim 3, wherein when the memory device performs a set writing operation or a reading operation, the voltage level of the first voltage is equal to or greater than a sum of a voltage level of a set write voltage or a read voltage provided to a first signal line selected from among the plurality of first signal lines as a bias voltage and a threshold voltage level of the first switch, and the voltage level of-the second voltage is greater than a threshold voltage level of the second switch.

6. The memory device of claim 3, wherein when the memory device performs a set writing operation or a reading operation, the voltage level of the first voltage is greater than a threshold voltage level of the first switch, and the voltage level of the second voltage is greater than a voltage level of an inhibit voltage provided to unselected first signal lines from among the plurality of first signal lines as a bias voltage and a threshold voltage level of the second switch.

7. The memory device of claim 1, further comprising:
a decoding block receiving the first voltage and the second voltage, and generating the first switching signal having the first voltage or the second switching signal having the second voltage based on an address; and
a voltage driving unit for providing the bias voltage to each of the plurality of line selection switch units.

8. The memory device of claim 7, further comprising:
a voltage generator generating the first voltage and the second voltage, and varying at least one of the first voltage and the second voltage according to the operating mode of the memory device.

9. The memory device of claim 8, wherein the voltage generator comprises:
a voltage selector for selecting the first voltage or the second voltage from among at least one power voltage applied from outside and at least one internal voltage generated in the memory device according to the operating mode of the memory device; and
a charge pump for generating the at least one internal voltage.

10. A memory device comprising:
a memory cell array comprising a first region comprising a first plurality of memory cells including at least one selected memory cell and unselected memory cells, and a second region comprising a second plurality of memory cells, the second plurality of memory cells being unselected memory cells; and
a switch block applying a selection voltage or an inhibit voltage to first signal lines in the first region in response to a first voltage of a first switching signal, and applying an inhibit voltage to first signal lines in the second region in response to a second voltage of a second switching signal, voltage levels of the first voltage and the second voltage are different from each other, and
wherein the switch block comprises a plurality of switch units, and each of the plurality of switch units includes a first MOS transistor and a second MOS transistor of a same conductive type, and connected respectively to the first signal lines in the first region and the second region.

11. The memory device of claim 10, wherein the first MOS transistor is turned on when a voltage level of the first switching signal is the first voltage, and the second MOS transistor is turned on when a voltage level of the second switching signal is the second voltage.

12. The memory device of claim 11, wherein at least one of the first voltage and the second voltage varies depending on an operating mode of the memory device.

13. A method of operating a memory device comprising a plurality of memory cells arranged respectively in regions where a plurality of first signal lines and a plurality of second signal lines cross each other, and each of the plurality of first signal lines is connected to at least two first conductive type transistor switches for providing a bias voltage, the method comprising:
applying a first voltage to one of the at least two first conductive type transistor switches that are connected to at least one first signal line, so that the one of the at least two first conductive type transistor switches is turned on and a selection voltage is applied to the at least one first signal line from among the plurality of first signal lines; and
applying a second voltage having a different voltage level than a voltage level of the first voltage to another of the at least two first conductive type transistor switches, so that the another one of the at least two first conductive type transistor switches is turned on and an inhibit voltage is provided to the at least one first signal line.

14. The method of claim 13, wherein when the memory device performs a set writing operation or a reading operation, the voltage level of the first voltage is higher than the voltage level of the second voltage.

15. The method of claim 13, wherein when the memory device performs a reset writing operation, the voltage level of the first voltage is lower than the voltage level of the second voltage.

16. The method of claim 13, wherein the at least two first conductive type transistors comprise a first NMOS transistor and a second NMOS transistor, the first NMOS transistor being turned on in response to the first voltage, and the second NMOS transistor being turned on in response to the second voltage.

* * * * *